(12) United States Patent
Kamiyama et al.

(10) Patent No.: US 6,326,638 B1
(45) Date of Patent: Dec. 4, 2001

(54) SEMICONDUCTOR LIGHT EMITTING ELEMENT AND METHOD FOR FABRICATING THE SAME

(75) Inventors: Satoshi Kamiyama, Sanda; Masakatsu Suzuki, Katano; Takeshi Uenoyama, Kyoto; Kiyoshi Ohnaka, Moriguchi; Akira Takamori, Suita; Masaya Mannoh, Hirakata; Isao Kidoguchi; Hideto Adachi, both of Mino; Akihiko Ishibashi, Sakai; Toshiya Fukuhisa, Kyoto; Yasuhito Kumabuchi, Toyonaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/080,121

(22) Filed: May 15, 1998

Related U.S. Application Data

(62) Division of application No. 08/588,863, filed on Jan. 19, 1996, now Pat. No. 5,787,104.

(30) Foreign Application Priority Data

Jan. 19, 1995 (JP) .................................................. 7-006405

(51) Int. Cl.[7] .................................................. H01L 27/15
(52) U.S. Cl. .......................... 257/13; 257/86; 257/103; 257/190; 257/627; 428/620; 428/433; 428/450; 428/697; 428/698
(58) Field of Search .................................. 428/446, 450, 428/697, 698, 620, 433; 372/43, 44, 45; 257/617, 627, 190, 918, 13, 86, 103

(56) References Cited

U.S. PATENT DOCUMENTS

| | | | |
|---|---|---|---|
| 5,006,908 | * 4/1991 | Matsuoka et al. | 357/17 |
| 5,079,774 | 1/1992 | Mendez et al. | 372/27 |
| 5,255,279 | * 10/1993 | Takahashi et al. | 372/46 |
| 5,381,260 | 1/1995 | Ballato et al. | 359/248 |
| 5,534,950 | * 7/1996 | Hargis et al. | 348/758 |
| 5,537,433 | * 7/1996 | Watanabe | 372/45 |
| 5,787,104 | * 7/1998 | Kamiyama et al. | 372/43 |

FOREIGN PATENT DOCUMENTS

| | | |
|---|---|---|
| 406029574A | * 2/1994 | (JP) . |
| 7-162038 | 6/1995 | (JP) . |

OTHER PUBLICATIONS

"inGaN/AlGaN blue–light–emitting diodes," S. Nakamura, *J. Vac. Sci. Technol. A*, vol. 13, No. 3, pp. 705–710, (1995).

H. Amano et al., "Heteroepitaxial Growth and the Effect of Strain on the Luminescent Properties of GaN Films on (1120) and (0001) Sapphire Substrates", Japanese Journal of Applied Physics, vol. 27, No. 8, Aug., 1988, pp. L1384–L1386.

Nido, "Effect of Biaxial Strain on Cubic and Hexagonal GaN Analyzed by Tight–Binding Method", Jpn. J. Appl. Phys. vol. 34, Part 2, No. 11B, pp. 1513–1516.

* cited by examiner

*Primary Examiner*—Deborah Jones
*Assistant Examiner*—Stephen Stein
(74) *Attorney, Agent, or Firm*—Ratner & Prestia

(57) ABSTRACT

The semiconductor laser of this invention includes an active layer formed in a c-axis direction, wherein the active layer is made of a hexagonal-system compound semiconductor, and anisotropic strain is generated in a c plane of the active layer.

4 Claims, 31 Drawing Sheets

| Material | Thermal expansion coefficient |
|---|---|
| LiTaO$_3$ | $1.2 \times 10^{-6}$ (0001)<br>$2.2 \times 10^{-5}$ (11$\bar{2}$0) |
| GaN | $5.6 \times 10^{-6}$ |

*FIG. 16A* High temperature
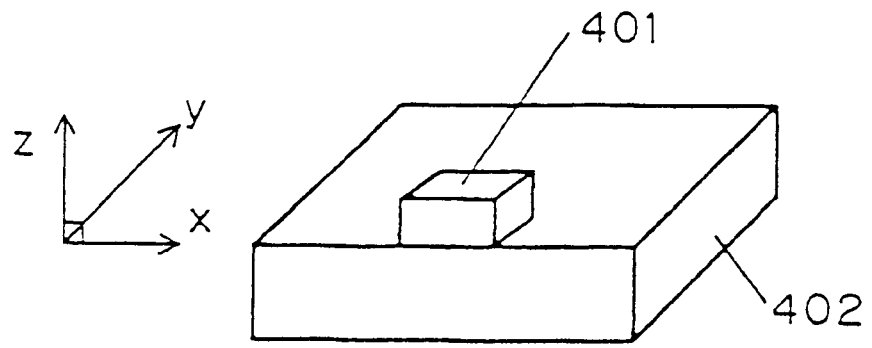
*FIG. 16B* Room temperature
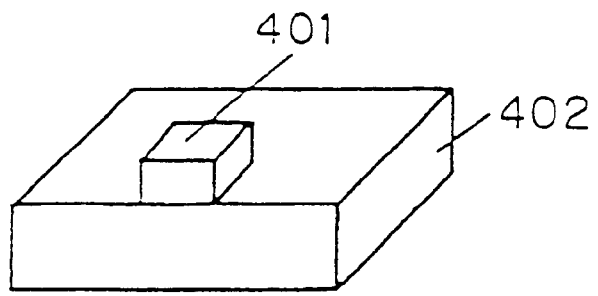

High temperature

Room temperature

C axis

C axis

SEMICONDUCTOR LIGHT EMITTING ELEMENT AND METHOD FOR FABRICATING THE SAME

This application is a division of U.S. patent application No. 08/588,863, filed Jan. 19, 1996 now U.S. Pat. No. 5,787,104.

The entire disclosure of U.S. patent application 08/588,863 filed Jan. 19, 1996 is expressly incorporated by reference herein.

BACKGROUND OF THE INVENTION

1. Field of the Invention

The present invention relates to a short-wavelength semiconductor light emitting element used in the fields of optical communications, optical information processing, and the like, and a method for fabricating the same.

2. Description of the Related Art

In recent years, with increased demands for short-wavelength semiconductor light emitting elements in various fields, studies focusing mainly on ZnSe and GaN as the materials for such elements have been vigorously conducted. As for ZnSe material, a short-wavelength semiconductor laser with an oscillation wavelength of about 500 nm has succeeded in oscillating consecutively at room temperature. Now, study and development for practical use of this material is under way. As for GaN material, a blue light emitting diode with high luminance has recently been realized. The reliability of this material as the light emitting diode is by no means inferior to that of other materials for semiconductor light emitting elements. GaN material is therefore expected to be applicable to a semiconductor laser.

However, the properties of GaN material are not clearly known; moreover, GaN material has a hexagonal-system crystalline structure. Therefore, it is uncertain whether GaN material can provide characteristics durable enough for practical use when it is used as an element having a structure similar to that used for conventional cubic-system materials.

SUMMARY OF THE INVENTION

The semiconductor laser of this invention includes an active layer formed in a c-axis direction, wherein the active layer is made of a hexagonal-system compound semiconductor and anisotropic strain is generated in a c plane of the active layer.

In another aspect of the present invention, a method for fabricating a semiconductor laser is provided. The method includes the step of forming an active layer made of a hexagonal-system compound semiconductor in a c-axis direction, wherein the active layer is formed so that anisotropic strain is generated in a c plane.

Alternatively, the semiconductor light emitting element of this example includes: a semiconductor substrate; a stripe groove formed on a principal plane of the semiconductor substrate; and a semiconductor light emitting layer formed on the other principal plane of the semiconductor substrate.

Alternatively, the method for fabricating a semiconductor light emitting element of this example includes the steps of: forming a stripe-shaped groove on a principal plane of a semiconductor substrate; and forming a light emitting element structure on the other principal plane of the semiconductor substrate.

Alternatively, the method for fabricating a semiconductor light emitting element of this invention includes the steps of: forming a stripe-shaped mask on a principal plane of a semiconductor substrate; etching the semiconductor substrate selectively using the mask; depositing material having a thermal expansion coefficient different from that of the semiconductor substrate on the semiconductor substrate selectively using the mask; and forming a light emitting element structure on the other principal plane of the semiconductor substrate.

Alternatively, the semiconductor light emitting element of this example includes: a semiconductor substrate; a stripe-shaped member formed on a principal plane of the semiconductor substrate, the member being made of a material having a thermal expansion coefficient different from that of the semiconductor substrate; and a semiconductor light emitting layer formed on the other principal plane of the semiconductor substrate.

Alternatively, the method for fabricating a semiconductor light emitting element of this example includes the steps of: forming a stripe-shaped member on a principal plane of a semiconductor substrate, the member being made of a material having a thermal expansion coefficient different from that of the semiconductor substrate; and forming a light emitting element structure on the other principal plane of the semiconductor substrate.

Alternatively, the method for fabricating a semiconductor light emitting element of this example includes the steps of: forming a light emitting element structure on a surface of a semiconductor substrate; and forming a stripe-shaped member on the other surface of the semiconductor substrate at 300° C. or more, the member being made of a material having a thermal expansion coefficient different from that of the semiconductor substrate.

Alternatively, the method for fabricating a semiconductor light emitting element of this example includes the steps of: forming a light emitting element structure on a principal plane of a semiconductor substrate; forming a stripe-shaped member on the other surface of the semiconductor substrate, the member being made of a material having a thermal expansion coefficient different from that of the semiconductor substrate; and heat-treating the semiconductor substrate at 500° C. or more.

Alternatively, the semiconductor light emitting element of this example includes: a semiconductor substrate; a first metal formed on a principal plane of the semiconductor substrate; a stripe-shaped second metal formed on the first metal; and a light emitting element structure formed on the semiconductor substrate.

Alternatively, the method for fabricating the semiconductor light emitting element of this example includes the steps of: forming a light emitting element structure on a principal plane of a semiconductor substrate; depositing a first metal on the other principal plane of the semiconductor substrate; and depositing a stripe-shaped second metal on the first metal.

Alternatively, the method for fabricating a semiconductor light emitting element of this invention includes the steps of: attaching a semiconductor substrate to a surface of a body which is part of a curved surface of a cylinder; and forming a light emitting element structure on the semiconductor substrate.

Alternatively, the semiconductor light emitting element of this invention includes: a substrate having a principal plane; and a wurtzite-type AlGaInN compound semiconductor formed on the substrate, wherein the substrate is made of a material of which thermal expansion coefficient is anisotropic in the principal plane.

Alternatively, the semiconductor light emitting element of this invention includes a substrate having a principal plane and a wurtzite-type AlGaInN compound semiconductor formed on the substrate, wherein the substrate is made of a material of which thermal expansion coefficient is greater in a first direction in the principal plane and smaller in a second direction vertical to the first direction than the thermal expansion coefficient of the wurtzite-type AlGaInN compound semiconductor.

Alternatively, the semiconductor light emitting element of this invention includes a wurtzite-type AlGaInN compound semiconductor where a total of a thermal strain in a first direction in a substrate plane and a thermal strain in a second direction vertical to the first direction generated when the element is cooled from a growth temperature to room temperature is zero.

Alternatively, the semiconductor light emitting element of this invention includes: an active layer made of a wurtzite-type compound semiconductor; a pair of carrier confinement layers sandwiching the active layer; and a stripe-shaped strain generating layer having a lattice constant different from that of the pair of carrier confinement layers.

Alternatively, the method for fabricating a semiconductor light emitting element of this invention includes the steps of: placing a semiconductor light emitting element having a double-hetero structure on an anisotropic crystal; and securing the semiconductor light emitting element to the anisotropic crystal at 100° C. or more.

Alternatively, the method for fabricating a semiconductor light emitting element of this invention includes the steps of: placing a semiconductor light emitting element having a double-hetero structure on a bimetal; and securing the semiconductor light emitting element to the bimetal at 100° C. or more.

Alternatively, the method for fabricating a semiconductor light emitting element of this invention includes the steps of: placing a semiconductor light emitting element having a double-hetero structure on a sub-mount; applying stress to the semiconductor light emitting element from a top surface or a side face thereof; and securing the semiconductor light emitting element to the sub-mount.

Alternatively, the method for fabricating an AlGaInN semiconductor light emitting element of this invention including a substrate having a step and an AlGaInN double-hetero structure formed on the substrate is provided. The method includes the steps of: forming at least two strip grooves on an AlGaInN thin film to obtain a mesa structure; and forming a multilayer structure including the AlGaInN double-hetero structure on the entire top surface of the substrate including the inside of the at least two stripe grooves so that a crystal mixture ratio of AlGaInN on a flat surface of the mesa structure is different from that on a slope surface of the mesa structure.

Alternatively, the method for fabricating an AlGaInN semiconductor light emitting element of this invention including a substrate having a step and an AlGaInN double-hetero structure formed on the substrate. The method comprising the steps of: forming a stripe groove on an AlGaInN thin film to obtain a concave groove structure; and forming a multilayer structure including the AlGaInN double-hetero structure on the entire top surface of the substrate including the inside of the stripe groove so that a crystal mixture ratio of AlGaInN on a flat surface of the concave groove structure is different from that on a slope surface of the concave groove structure.

Alternatively, the method for fabricating a nitride compound semiconductor of this invention includes the step of forming a nitride compound semiconductor by vapor phase epitaxy while selectively irradiating the nitride compound semiconductor, so as to form an irradiated portion and a non-irradiated portion having different lattice constants.

Alternatively, the method for fabricating a nitride compound semiconductor of this invention includes the steps of: forming a nitride compound semiconductor by vapor phase epitaxy while selectively irradiating the nitride compound semiconductor, so as to form an irradiated portion and a non-irradiated portion having different lattice constants; and forming a nitride compound semiconductor by vapor phase epitaxy at a temperature higher than a temperature used for the former growth step.

Alternatively, the semiconductor light emitting element of this invention includes: a substrate; a first cladding layer formed on the substrate, an area of a plane parallel to the substrate being smaller than an area of a surface of the substrate; a second cladding layer formed on the first cladding layer, an area of a plane parallel to the substrate being larger than the area of the first cladding layer, the second cladding layer being made of crystal having a lattice constant different from that of the first cladding layer; an active layer formed on the second cladding layer; and a third cladding layer formed on the active layer.

Alternatively, the method for fabricating a semiconductor light emitting element of this invention includes the steps of: forming a first cladding layer on a substrate; forming a second cladding layer on the first cladding layer; forming an active layer on the second cladding layer; forming a third cladding layer on the active layer; and etching so that the first cladding layer can be etched faster than the substrate, the second cladding layer, the active layer, and the third cladding layer.

Alternatively, the method for fabricating a semiconductor light emitting element of this invention includes the steps of: forming a first cladding layer on a substrate; forming a second cladding layer on the first cladding layer; forming an active layer on the second cladding layer; forming a third cladding layer on the active layer; forming an insulating film on faces of the substrate, the first cladding layer, the second cladding layer, the active layer, and the third cladding layer vertical to a depositing direction; removing a portion of the insulating film so as to expose the side face of the first cladding layer; and etching so that the first cladding layer can be etched faster than the insulating film.

Alternatively, the method for fabricating a semiconductor light emitting element of this invention includes the steps of: forming a first conductive semiconductor on a substrate; forming an insulating semiconductor on the first conductive semiconductor, the insulating semiconductor having a lattice constant different from that of the first conductive semiconductor; forming a semiconductor layer of a double-hetero structure on the insulating semiconductor; and etching the first conductive semiconductor by immersing the substrate, the first conductive semiconductor, and the insulating semiconductor in an electrolytic solution and attaching a positive electrode and a negative electrode to the first conductive semiconductor or the insulating semiconductor for applying a voltage between the electrodes.

Alternatively, the semiconductor light emitting element of this invention includes: a substrate; a semiconductor crystal nucleus deposited on the substrate; a thin film spirally formed around the crystal nucleus in parallel to the substrate; a first cladding layer formed on the thin film; an active layer formed on the first cladding layer; and a second cladding layer formed on the active layer.

Alternatively, the method for fabricating a semiconductor light emitting element of this invention includes the steps of:

forming a semiconductor crystal nucleus on a substrate under a first pressure condition by vapor phase epitaxy; forming a thin film around the crystal nucleus spirally in parallel to the substrate under a second pressure condition; forming a first cladding layer under a third pressure condition; forming an active layer on the first cladding layer under the third pressure condition; and forming a second cladding layer on the active layer under the third pressure condition.

In still another aspect of the present invention, a semiconductor light emitting device is provided. The device includes a base having a concave portion and a semiconductor light emitting element formed in the concave portion, wherein an active layer of the semiconductor light emitting element is made of a hexagonal-system compound semiconductor, and anisotropic strain is generated in a c plane of the active layer due to stress from the base.

Alternatively, the semiconductor light emitting device of this invention includes a semiconductor light emitting element and a stress applying portion for applying stress to an active layer of the semiconductor light emitting element, wherein the active layer of the semiconductor light emitting element is made of a hexagonal-system compound semiconductor, and anisotropic strain is applied to a c plane of the active layer from the stress applying portion.

In still another aspect of the present invention, an epitaxial method for epitaxially growing crystal on a substrate causing lattice mismatching is provided. In the method, lattice strain generated in an epitaxial layer due to the lattice mismatching between crystals of the substrate and the epitaxial layer is concentrated in a specific direction of the epitaxial layer, so as to generate anisotropic strain in the epitaxial layer.

Thus, the invention described herein makes possible the advantages of (1) providing a semiconductor light emitting element with high performance and a simple structure where the strain characteristic of an electronic band structure unique to a hexagonal-system compound semiconductor is utilized, i.e., providing a semiconductor light emitting element with a low threshold current by applying anisotropic strain to the c plane of a hexagonal-system compound semiconductor, and (2) providing a method for fabricating such a semiconductor light emitting element.

These and other advantages of the present invention will become apparent to those skilled in the art upon reading and understanding the following detailed description with reference to the accompanying figures.

BRIEF DESCRIPTION OF THE DRAWINGS

FIGS. 16A and 16B are perspective views showing a fabrication process of a semiconductor laser of Example 4 according to the present invention.

DESCRIPTION OF THE PREFERRED EMBODIMENTS

The inventors have found that the effective mass of holes near the top of a valence band is reduced when strain which is not isotropic (anisotropic strain) is applied to the c plane of a hexagonal-system compound semiconductor. Using this property, a semiconductor light emitting element with a low threshold current can be realized by applying anisotropic strain to the c plane of an active layer composed of a hexagonal-system compound semiconductor grown in a c-axis direction. The "isotropic" strain as used herein refers to a strain applied to the c plane hydrostatically (isotropically).

Hereinbelow, the strain characteristic of the electronic band structure of a valence band of a hexagonal-system compound semiconductor used in the present invention will be described with reference to the accompanying drawings.

Figure 1:
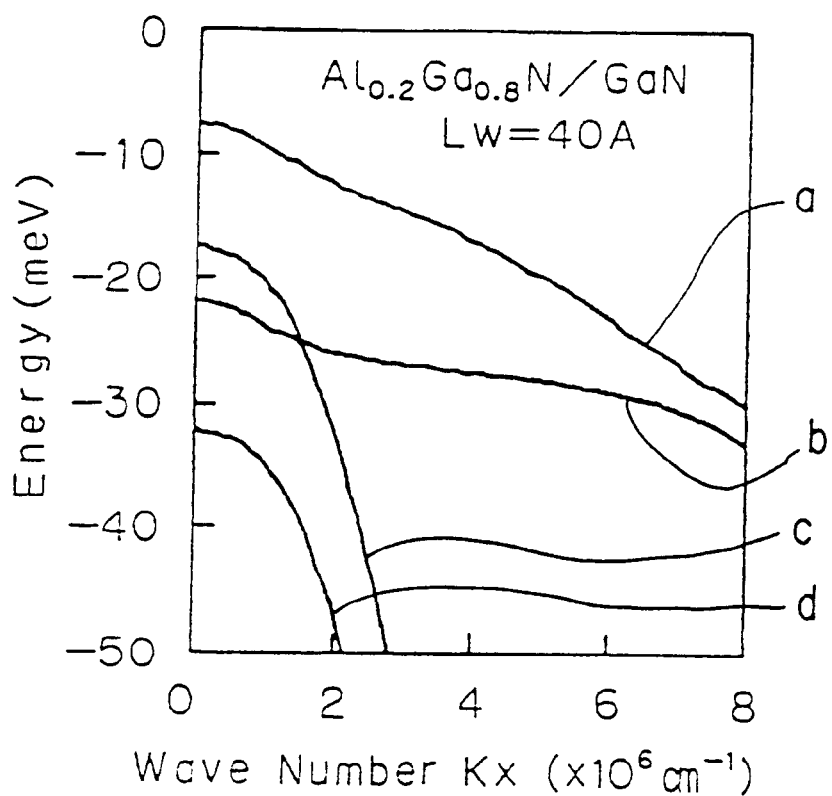
FIG. 1 shows an electronic band structure of a valence band of a GaN layer of an AlGaN/GaN quantum well structure.

FIG. 1 shows an electronic band structure of a valence band of a GaN quantum well layer of an AlGaN/GaN quantum well structure when no strain is applied. The quantum well structure is composed of an AlGaN barrier layer and the GaN quantum well layer. The thickness of the GaN quantum well layer is 4 nm. In FIG. 1, a curve a represents a first-level energy band of a heavy hole, a curve b a second-level energy band of a heavy hole, a curve c a first-level energy band of a light hole, and a curve d a second-level energy band of a light hole.

It is observed from FIG. 1 that the effective mass of holes near the top of the valence band (near wave number 0) is significantly large compared with that of zincblende type compound semiconductors. Also, when uniaxial strain in the c-axis direction or an isotropic (biaxial) strain in the c plane is applied to the GaN quantum well layer, the effective mass of holes near the top of the valence band is almost the same as that obtained when no strain is applied. The uniaxial strain in the c-axis direction refers to the case where strain is applied only in the c-axis direction of the hexagonal-system compound semiconductor. The biaxial strain in the c plane refers to the case where strains of an equal magnitude are applied along axes vertical to each other, which is also referred to as the isotropic strain.

A deformation energy generated by the application of anisotropic strain in the c plane of a hexagonal-system compound semiconductor can be expressed by $D_5(e_{xx}-e_{yy}+2ie_{xy})$ where $D_5$ denotes the deformation potential when anisotropic strain is applied in the c plane, $e_{xx}$ and $e_{yy}$ denote the strains in two directions perpendicular to each other in the c plane, and $e_{xy}$ denotes the shearing strain in the c plane.

Figure 2:
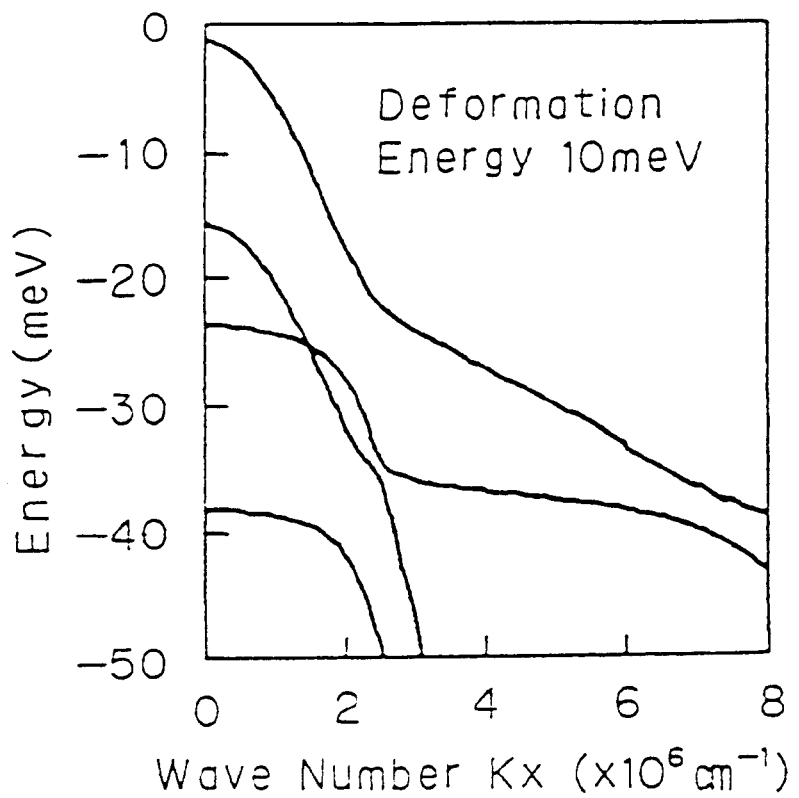
FIG. 2 shows an electronic band structure of a valence band of a GaN layer of an AlGaN/GaN quantum well structure when anisotropic strain is applied to the c plane.

FIG. 2 shows an electronic band structure of the valence band of the GaN quantum well layer of the AlGaN/GaN quantum well structure when anisotropic strain having a deformation energy of 10 meV is applied in the c plane. As is observed from FIG. 2, the "curvature of the valence band" in the region of small wave numbers is reduced when anisotropic strain is applied. This indicates that the effective mass of holes near the top of the valence band is considerably small compared with the case where no strain is applied. This means that the state density near the top of the valence band decreases, and thus the injected current density required for laser oscillation can be low. Accordingly, only a small oscillation threshold current is required for a semiconductor laser having an active layer where anisotropic strain is applied to a quantum well layer thereof.

Figure 3:
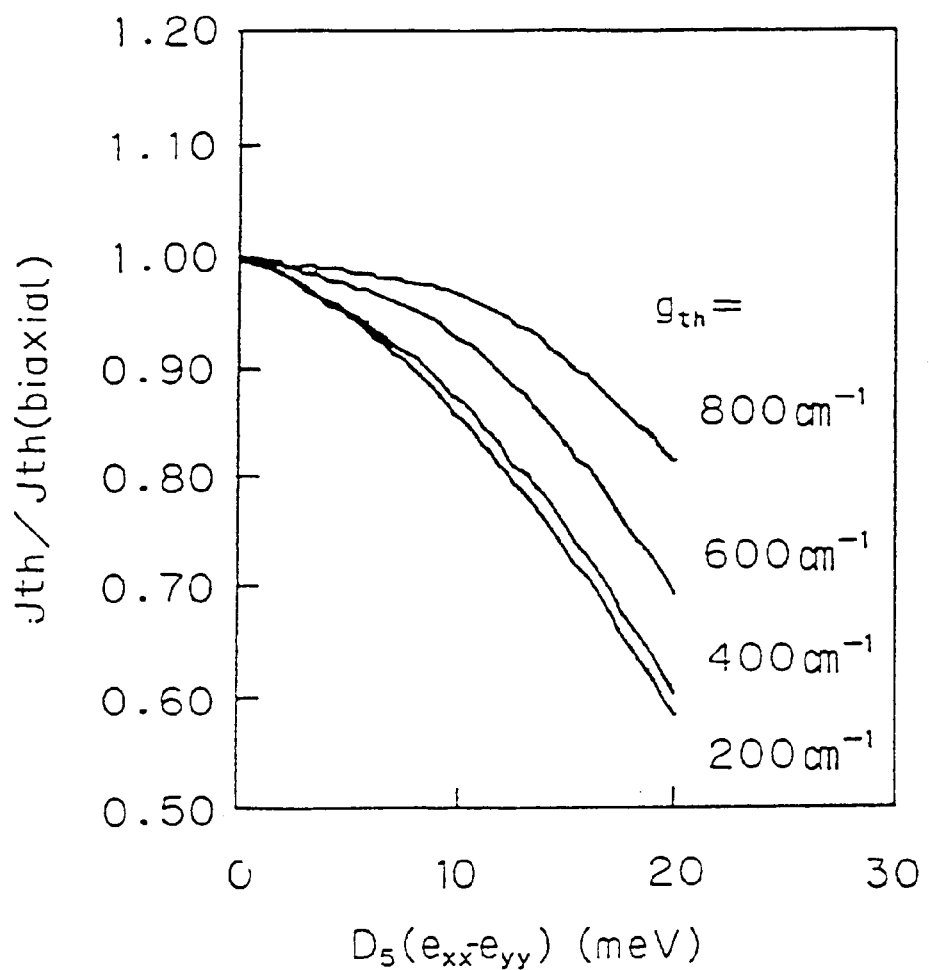
FIG. 3 shows the strain dependency of the threshold current density when anisotropic strain is applied to the c plane.

FIG. 3 shows the strain dependency of the threshold current density observed when anisotropic strain is applied to the c plane. The X axis represents the deformation energy and the Y axis represents the threshold current density standardized by a value obtained when no strain is applied. The results obtained when the threshold gain is varied are shown in FIG. 3. As is observed from FIG. 3, the threshold current density significantly decreases by the application of anisotropic strain, irrespective of the threshold gain values.

Though the shearing strain in the c plane is not taken into consideration in FIG. 3, a similar effect to the above is observed when shearing strain is applied to the c plane.

As described above with reference to FIGS. 1 to 3, it has been found that, as for the semiconductor light emitting element using a hexagonal-system compound semiconductor as an active layer, an element requiring only a small threshold current can be realized by applying anisotropic strain to the active layer.

Now, the element where anisotropic strain is applied to a hexagonal compound semiconductor and the method for fabricating the same according to the present invention will be described by way of examples.

EXAMPLE 1

The semiconductor light emitting element of Example 1 according to the present invention will be described with reference to FIG. 4. An AlGaInN material which is a III–V group compound semiconductor is used as a hexagonal-system compound semiconductor. Strain is applied in a direction parallel to the c plane. When a wurtzite-type material is used for an AlGaInN light emitting layer 100, the band structure (valence band) can be changed by applying uniaxial strain in a direction vertical to the (0001) axis (parallel to the c plane). As a result, the characteristics of the light emitting element improve as described above.

Figure 4:
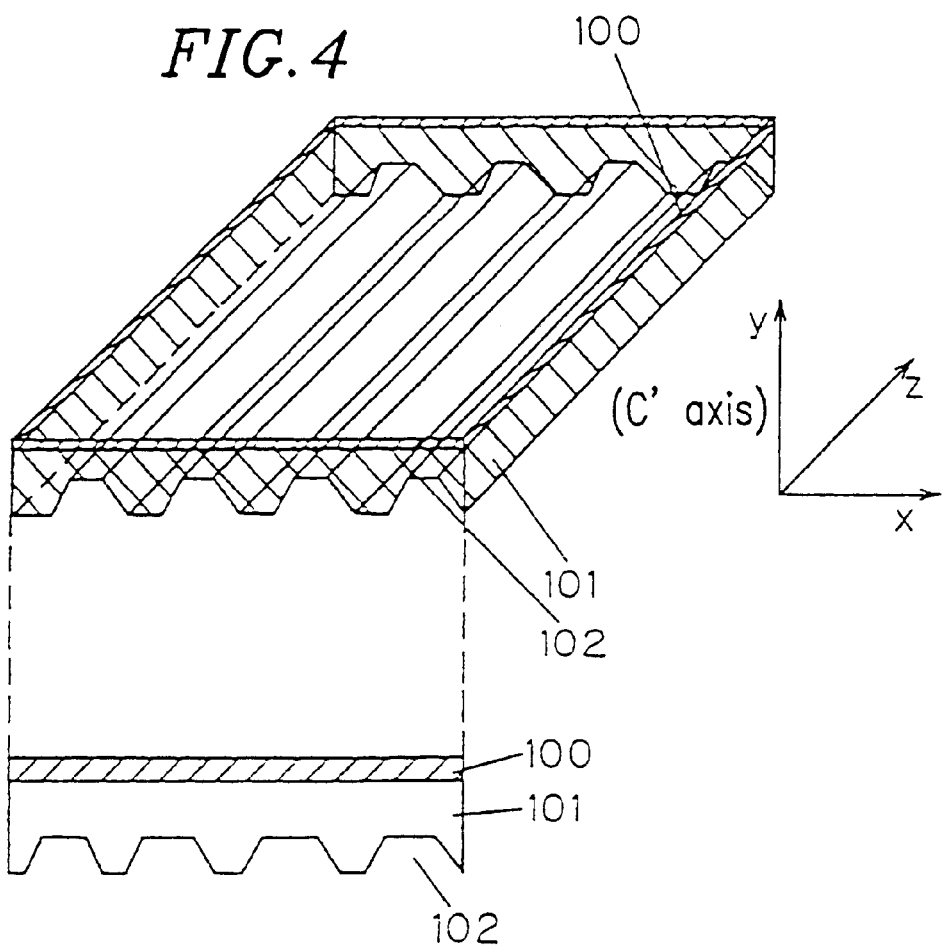
FIG. 4 shows a semiconductor light emitting element of Example 1 according to the present invention.
Figure 5A:
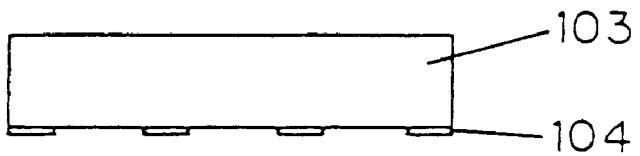
FIGS. 5A to 5E are sectional views showing a fabrication process of the semiconductor light emitting element of Example 1 according to the present invention.
Figure 5B:
Figure 5C:
Figure 5D:
Figure 5E:
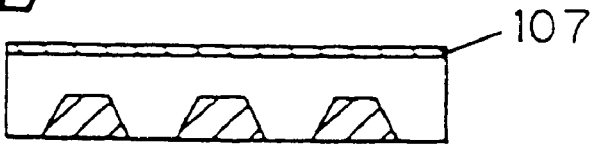

By forming stripe-shaped grooves 102 on a sapphire substrate 101 as shown in FIG. 4, the directivity of the thermal expansion coefficient is exhibited on the substrate 101. By this formation of the grooves 102, it is possible to apply uniaxial strain in the x direction shown in FIG. 4 to the AlGaInN light emitting layer 100 grown on the surface of the substrate 101 opposite to the grooves 102. Using the light emitting layer 100 as an active layer, a semiconductor light emitting element with a small threshold current can be realized.

The method for fabricating the semiconductor light emitting element of Example 1 will be described with reference to FIGS. 5A to 5E.

First, a stripe-shaped mask 104 is formed on a principal plane of a sapphire substrate 103. Then, the substrate 103 is etched with an etchant such as hot sulfuric acid using the mask 104 so as to form stripe-shaped grooves 105. Then, a material such as AlN is selectively grown on the substrate 103 using the mask 104 so as to form AlN buried layers 106 only in the grooves 105. As a result, the thermal expansion coefficient distribution is generated in the thickness direction. This makes it possible to generate uniaxial strain in the substrate when an AlGaInN light emitting layer 107 is formed on the substrate by crystal growth at a high temperature equal to or more than 1000° C. in a later stage. Metalorganic vapor phase epitaxy (MOVPE) is used for the crystal growth. An appropriate temperature for the crystal growth of AlGaInN is considered to be about 1100° C. When the temperature is lowered and resumes room temperature, the AlGaInN light emitting layer 107 is in the state of having uniaxial strain.

The strain applied to the AlGaInN light emitting layer 107 can be greater when the AlN buried layers 106 are formed, because the formation of the buried layers increases the thermal expansion and thus improves the heat transfer from a heater. The absolute amount of the strain to be applied can be controlled by varying the width and depth of the grooves 105, so as to obtain an optimal structure for the light emitting element.

Figure 6A:
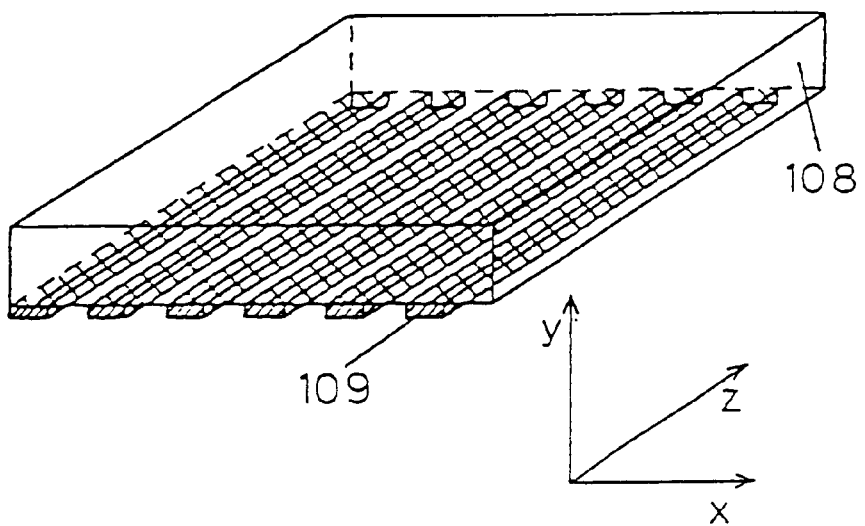
FIGS. 6A and 6B show another example of the semiconductor light emitting element according to the present invention.
Figure 6B:
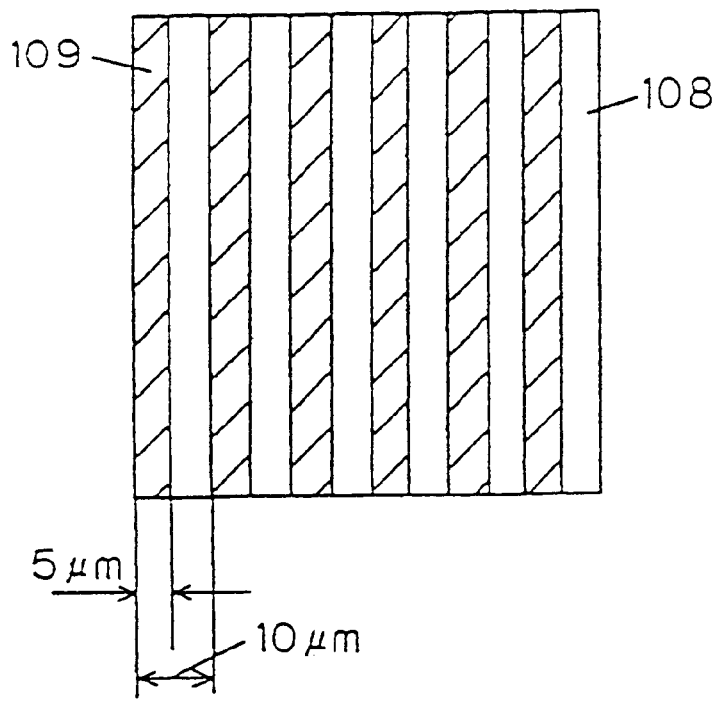
Figure 7:
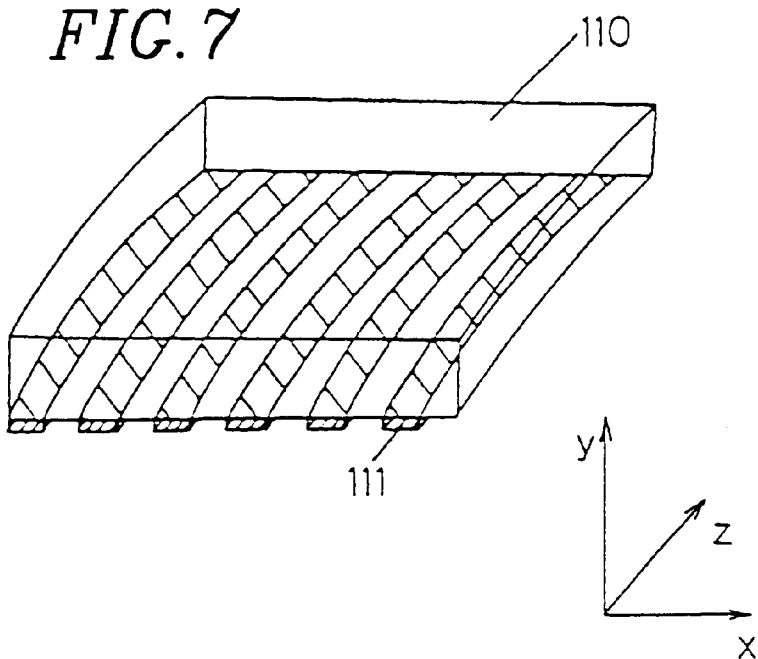
FIG. 7 shows still another example of the semiconductor light emitting element according to the present invention.

An alternative method for applying uniaxial strain to crystal is to form stripe-shaped oxide films on a substrate. FIGS. 6A, 6B, and 7 show an alternative example of the semiconductor light emitting element according to the present invention.

Before crystal growth, stripe-shaped oxide films 109 are formed on a principal plane of a sapphire substrate 108.

When the temperature is raised to 1000° C. or more for the crystal growth, the substrate is curved in the z direction shown in FIG. 7 due to the difference in the thermal expansion coefficient between the sapphire substrate 108 and the oxide films 109. The crystal growth is conducted while the curved state being maintained, and thereafter the temperature is lowered to room temperature. As a result, crystal having strain in the z direction is obtained. In this case, the strain amount can be controlled by the width and pitch of the stripes. For example, when a semiconductor laser is fabricated, the width and the pitch are preferably 5 microns and 10 microns, respectively.

Alternatively, the AlGaInN light emitting layer can be first formed by MOVPE. Then, the stripe-shaped oxide layers 109 are formed at a high temperature of about 500° C., so that a curve similar to the above can be formed and thus uniaxial strain can be generated in the crystal. Alternatively, the stripe-shaped oxide films 109 can be heated to a high temperature after the formation thereof.

Figure 8:
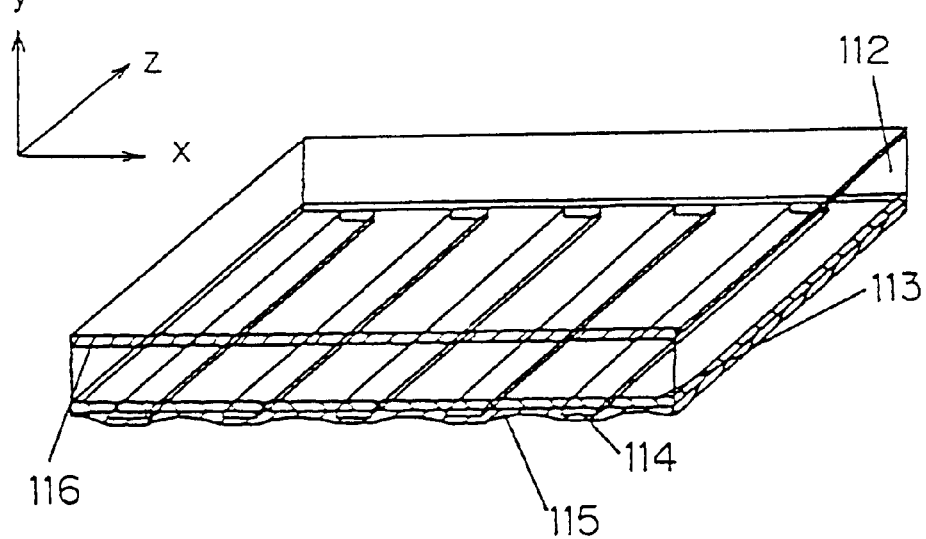
FIG. 8 shows still another example of the semiconductor light emitting element according to the present invention.

A bimetal effect can be used to provide an effect similar to the above. FIG. 8 shows still another example of the semiconductor light emitting element according to the present invention. It is effective to use SiC for a substrate 112. An AlGaInN light emitting layer 116 is first formed on the SiC substrate 112 by MOVPE. An Ni layer 113 is formed on the SiC substrate 112, and then stripe-shaped first Au layers 114 are formed on the Ni layer 113. The SiC substrate 112 is then curved in the z direction by the bimetal effect, and thus uniaxial strain is applied to the AlGaInN light emitting layer 116. In this case, the ohmic characteristic is exhibited by the Ni layer 113 to the SiC substrate 112, which provides an advantageous effect to the resultant semiconductor light emitting element.

Figure 9A:
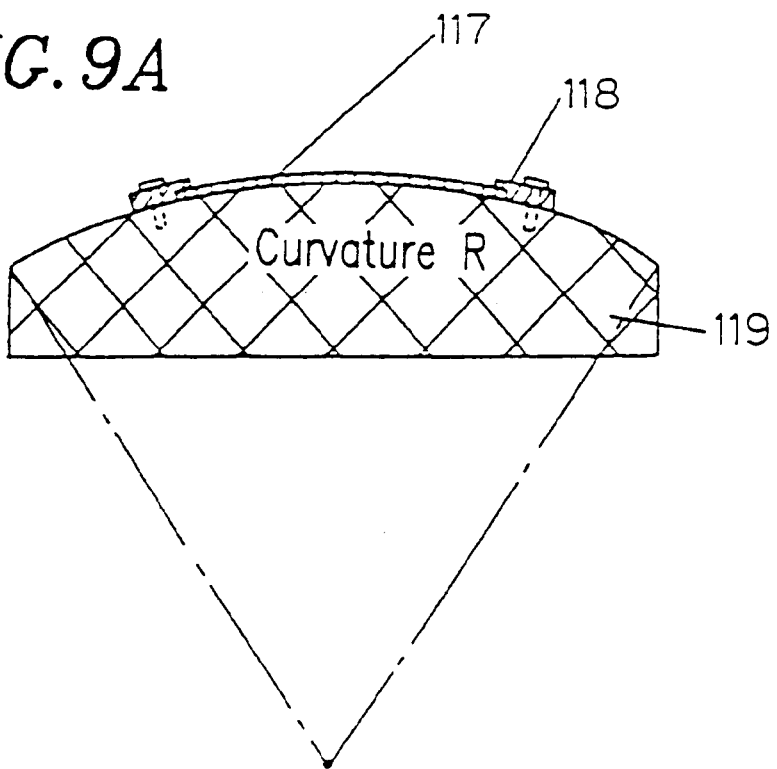
FIGS. 9A and 9B show a fabrication process of still another example of the semiconductor light emitting element according to the present invention.
Figure 9B:

FIGS. 9A and 9B show yet another example of the semiconductor light emitting device according to the present invention. In this alternative example, stress is applied externally before the crystal growth. A sapphire substrate 117 is secured on a tray 119 having a curvature R with fixtures 118. A light emitting layer is formed on the substrate 117, and then the substrate 117 is removed from the tray 119. While the substrate 117 gradually resumes the original shape, strain is applied to the light emitting layer. According to this method, the strain amount to be applied can be controlled by mechanically changing the curvature of the tray 119.

EXAMPLE 2

Figure 10:
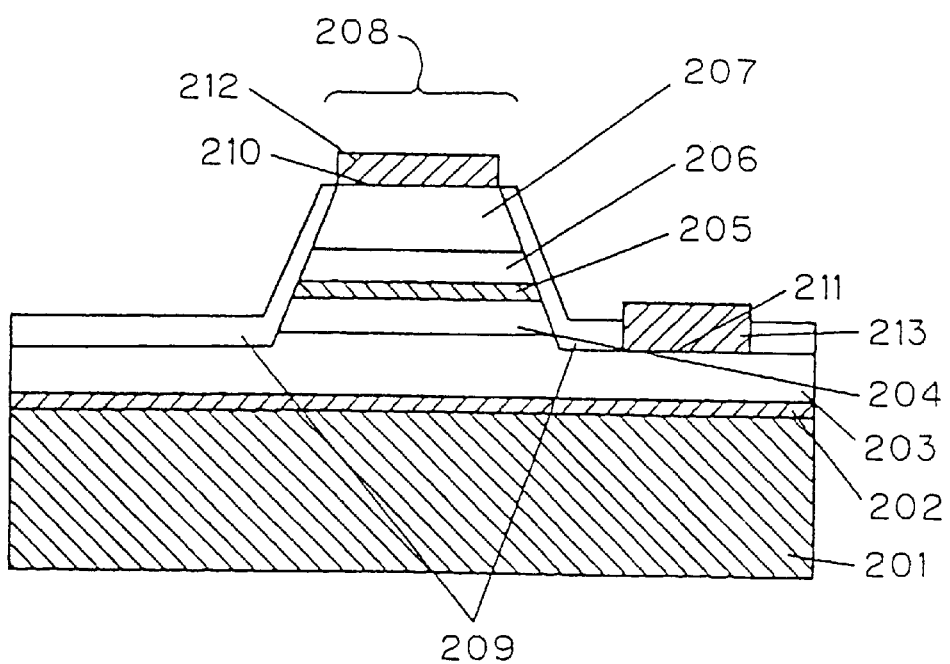
FIG. 10 is a sectional view of a wurtzite-type InGaN/AlGaN quantum well semiconductor laser of Example 2 according to the present invention.

FIG. 10 is a sectional view of a wurtzite-type $In_xGa_{1-x}N/Al_yGa_{1-y}N$ quantum well semiconductor laser of Example 2 according to the present invention. $In_xGa_{1-x}N$ and $Al_yGa_{1-y}N$ are used for a quantum well layer and a barrier layer, respectively.

Referring to FIG. 10, an AlN buffer layer 202, an $n-Al_zGa_{1-z}N$ cladding layer 203, an $Al_yGa_{1-y}N$ first optical guide layer 204, an $In_xGa_{1-x}N$/GaN multiple quantum well active layer 205 (a multilayer structure of $In_xGa_{1-x}N$ quantum well layers and GaN quantum well layers), an $Al_yGa_{1-y}N$ second optical guide layer 206, and a $p-Al_zGa_{1-z}N$ cladding layer 207 are consecutively formed in this order on a (1100) $LiTaO_3$ substrate 201 by MOVPE.

A ridge stripe 208 is formed by etching, and an $SiO_2$ insulating film 209 is formed over the top surface of the resultant structure. Openings 210 and 211 are formed at the $SiO_2$ insulating film 209 for current injection. Finally, an anode electrode 212 and a cathode electrode 213 are formed.

The layers constituting the wurtzite-type InGaN/AlGaN quantum well semiconductor laser are formed at a temperature range of 800 to 1100° C., except for the AlN buffer layer 202, when grown by MOVPE, for example, though the growth temperatures for the layers are often different from one another depending on the composition and material to be used. Accordingly, when room temperature is resumed after the crystal growth process, strain is generated in the crystal due to the difference in the thermal expansion coefficient between the crystal and the substrate. The crystal growth for all the layers after the polycrystalline AlN buffer layer 202 is conducted using the AlN buffer layer 202 as a seed crystal. Accordingly, the difference in the lattice constant between the (1100) $LiTaO_3$ substrate 201 and the other layers hardly affect the strain. There may be the case where the lattice constants are different among the hetero structure composed of the $n-Al_zGa_{1-z}N$ cladding layer 203 to the $p-Al_zGa_{1-z}N$ cladding layer 207, and this difference in the lattice constant may affect the strain. In such a case, however, suitable materials and thicknesses can be selected to prevent an occurrence of misfit dislocation and the like. However, the above-described strain due to the difference in the thermal expansion coefficient cannot be prevented. This strain is therefore positively utilized in this example.

Figure 11:
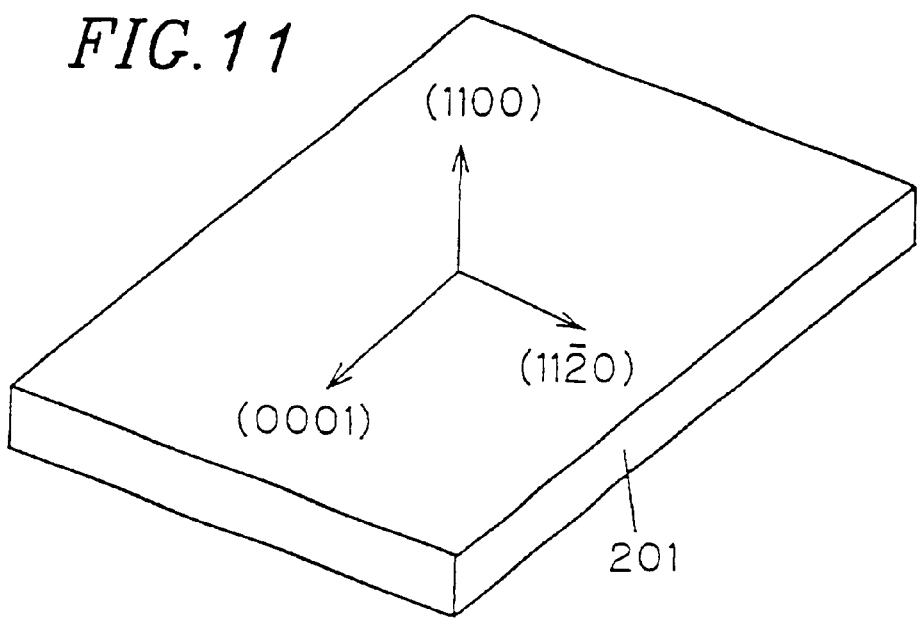
FIG. 11 shows two crystal plane directions perpendicular to each other on a $LiTaO_3$ substrate.
Figures 14, 15:
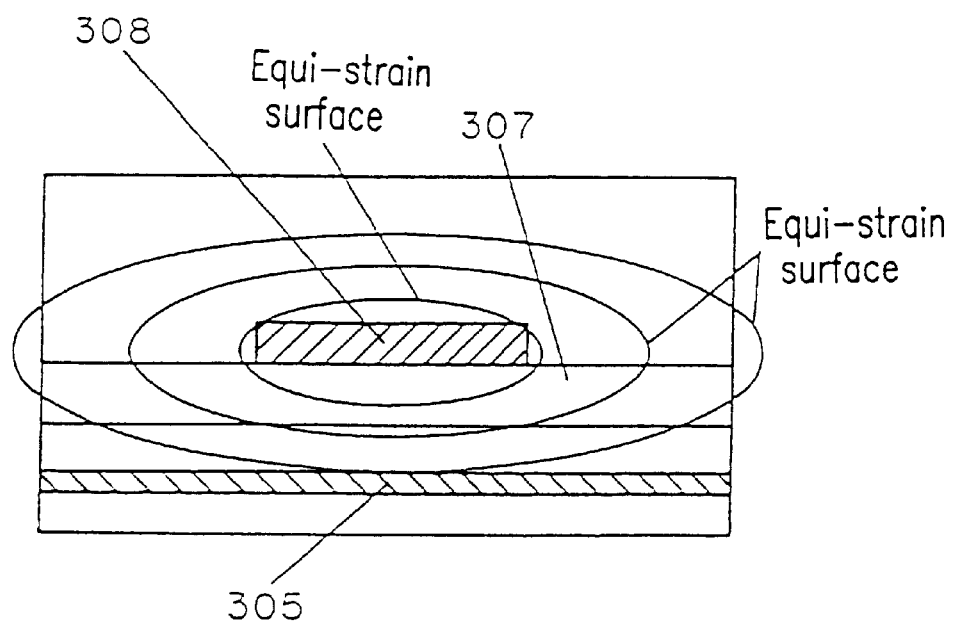
FIG. 14 shows strain locally generated in the vicinity of a p-$Al_zGa_{1-z}N$ strain generating layer.
FIG. 15 shows the thermal expansion coefficients of $LiTaO_3$ and GaN.

FIG. 15 shows the thermal expansion coefficients of the $LiTaO_3$ substrate 201 and the wurtzite-type GaN crystal in the plane. Since the (1100) $LiTaO_3$ substrate is used in this example, the thermal expansion coefficient is anisotropic in the plane, which is expressed by the (0001) direction and the (1120) direction vertical to the (0001) direction, as shown in FIG. 11. As for the wurtzite-type GaN material, crystal grows at the (0001) orientation regardless of the crystal plane direction of the substrate. Accordingly, each layer is formed vertically to the (0001) direction. The thermal expansion coefficient of the wurtzite-type GaN material is isotropic in the (0001) plane. The thermal expansion coefficient of GaN is $5.6\times10^{-6}$. Materials of AlGaInN mixed crystal of any composition have the thermal expansion coefficients near the above value. On the contrary, the LiTaO$_3$ substrate has a thermal expansion coefficient of $1.2\times10^{-6}$ which is smaller than that of GaN in the (0001) direction. In the (11$\bar{2}$0) direction, however, it has a thermal expansion coefficient of $2.2\times10^{-5}$ which is extremely larger than that of GaN. Accordingly, in the semiconductor laser shown in FIG. 10, when the thickness of the (1100) LiTaO$_3$ substrate 201 is sufficiently larger than the total thickness of the n-Al$_z$Ga$_{1-z}$N cladding layer 203 to the p-Al$_z$Ga$_{1-z}$N cladding layer 207 formed by crystal growth and the growth temperature of each layer is as high as 1000° C., a strain in the (0001) direction ($e_{xx}$) of −0.44% and a strain in the (11$\bar{2}$0) direction ($e_{yy}$) of 1.6% are generated in the crystals of the layers 203 to 207 when they are cooled to room temperature. In this way, anisotropic strain can be generated in the plane of the In$_x$Ga$_{1-x}$N/GaN multiple quantum well active layer 205. This greatly reduces the state density of the valence band and thus reduces the threshold current of the laser.

Figure 12:
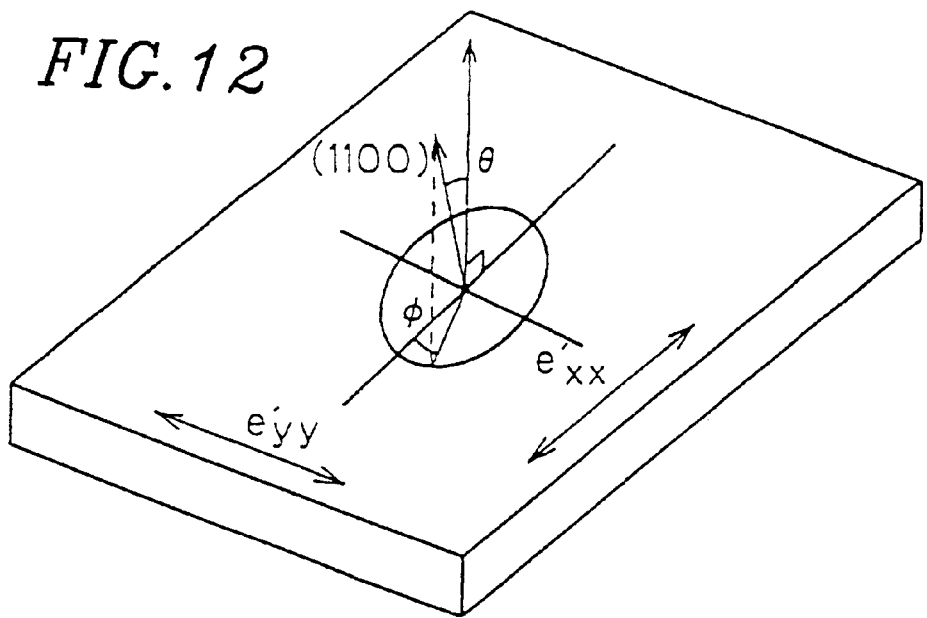
FIG. 12 shows the state where the $LiTaO_3$ substrate is inclined from the (1100) plane in the (0001) or (11$\bar{2}$0) direction.

In the case where the total thickness of the crystal growth layers 203 to 207 is large, the layers cannot bear the strain generated by the difference in the thermal expansion coefficient between the layers and the substrate, i.e., $e_{xx}$ and $e_{yy}$. This may cause dislocation defect and thus reduces the strain. In such a case, as shown in FIG. 12, the LiTaO$_3$ substrate may be tilted by θ toward the (0001) direction from the (1100) direction and by φ toward the (11$\bar{2}$0) direction. By this tilting, the strain generated in the respective directions in the crystal growth layers can be reduced to:

$e'_{xx} = -0.4 \cos θ$ $e'_{yy} = 1.6 \cos φ$.

Accordingly, by appropriately selecting q and f, an occurrence of the dislocation defect can be prevented. The effect of preventing the dislocation defect is especially high by selecting q and f so that $e'_{xx} + e'_{yy} = 0$.

In this example, LiTaO$_3$ was used for the substrate. However, other nonlinear optical crystal materials such as LiNbO$_3$, KTiOPO$_4$, KNbO$_3$, and LiB$_6$O$_{13}$ can also be used as long as they have large anisotropy in the thermal expansion coefficient and are stable in the growth temperature.

EXAMPLE 3

Figure 13:
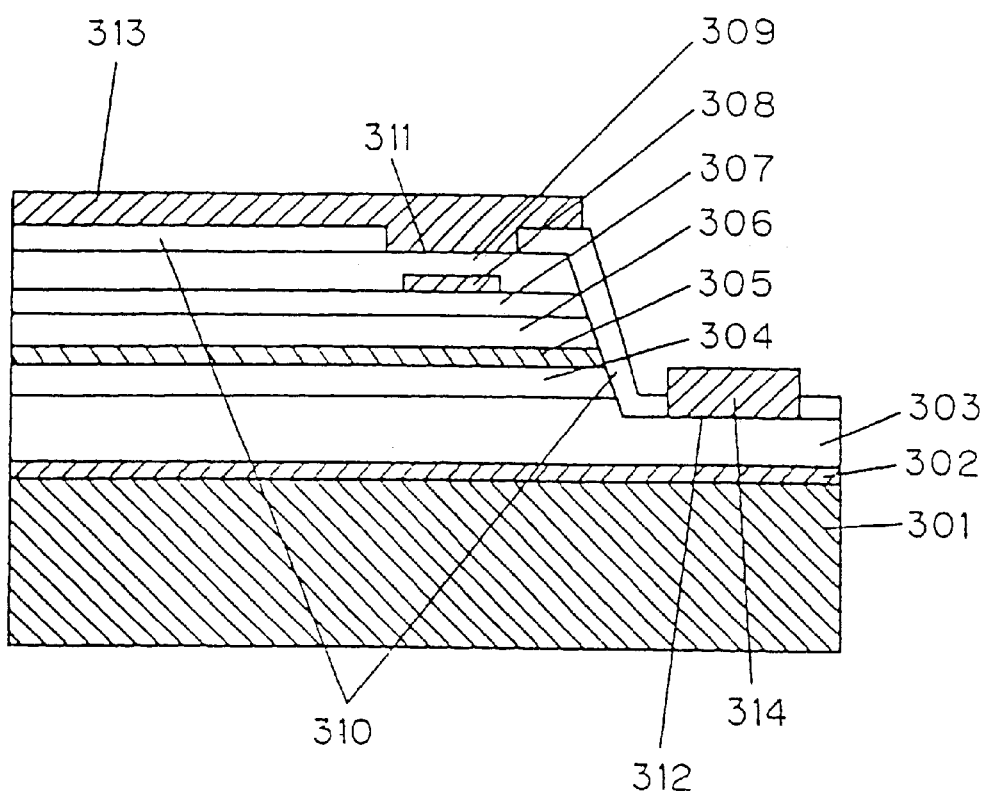
FIG. 13 is a sectional view of a wurtzite-type InGaN/AlGaN quantum well semiconductor laser of Example 3 according to the present invention.

FIG. 13 is a sectional view of a wurtzite-type InGaN/AlGaN quantum well semiconductor laser of Example 3 according to the present invention.

Referring to FIG. 13, an AlN buffer layer 302, an n-Al$_z$Ga$_{1-z}$N cladding layer 303, an Al$_y$Ga$_{1-y}$N first optical guide layer 304, an In$_x$Ga$_{1-x}$N/GaN multiple quantum well active layer 305, an Al$_y$Ga$_{1-y}$N second optical guide layer 306, a p-Al$_z$Ga$_{1-z}$N first cladding layer 307, and a p-Al$_{z'}$Ga$_{1-z'}$N strain generating layer 308 are consecutively formed in this order on a (0001) sapphire substrate 301 by crystal growth. Then, the resultant structure is taken out from a crystal growth apparatus, and the p-Al$_{z'}$Ga$_{1-z'}$N strain generating layer 308 is shaped into a stripe with a width of 2 mm by etching. The resultant structure is placed in the crystal growth apparatus again, and a p-Al$_z$Ga$_{1-z}$N second cladding layer 309 is formed. An SiO$_2$ insulating film 310 is then formed over the top surface of the resultant structure. Openings 311 and 312 are formed at the SiO$_2$ insulating film 310 for current injection. Finally, an anode electrode 313 and a cathode electrode 314 are formed.

When the Al composition ratio z' of the p-Al$_{z'}$Ga$_{1-z'}$N strain generating layer 308 is made larger than the Al composition ratio z of the p-Al$_z$Ga$_{1-z}$N first cladding layer 307 and the p-Al$_z$Ga$_{1-z}$N second cladding layer 309, the lattice constant of the former becomes smaller than that of the latter. As a result, compression strain can be generated in the surrounding crystals as shown in FIG. 14.

The above local strain can be generated because the width of the p-Al$_{z'}$Ga$_{1-z'}$N strain generating layer 308 is as small as about 2 mm. If the width is larger, strain is only generated in the p-Al$_{z'}$Ga$_{1-z'}$N strain generating layer 308 itself, not to the surrounding crystals. Since the p-Al$_{z'}$Ga$_{1-z'}$N strain generating layer 308 is of a stripe shape, strain is generated in the surrounding crystals in the plane vertical to the stripe, while it is not in the plane parallel to the stripe. As a result, strain is generated only in the plane of the In$_x$Ga$_{1-x}$N/GaN multiple quantum well active layer 305 vertical to the stripe, causing anisotropy in the strain and thus reducing the hole state density. The strain in the In$_x$Ga$_{1-x}$N/GaN multiple quantum well active layer 305 is greater as the multiple quantum well active layer 305 is nearer to the p-Al$_{z'}$Ga$_{1-z'}$N strain generating layer 308. Accordingly, the strain can be adjusted by setting the thickness of the p-Al$_z$Ga$_{1-z}$N first cladding layer 307 appropriately.

In this example, the Al composition ratio z' of the p-Al$_{z'}$Ga$_{1-z'}$N strain generating layer 308 was made larger than the Al composition ratio z of the p-Al$_z$Ga$_{1-z}$N first cladding layer 307 and the p-Al$_z$Ga$_{1-z}$N second cladding layer 309. Anisotropic strain can also be generated when the former is made smaller than the latter. In this case, especially, an optical waveguide structure can be realized by use of the p-Al$_{z'}$Ga$_{1-z'}$N strain generating layer 308, because the refractive index of the layer 308 is greater than that of the adjacent p-Al$_z$Ga$_{1-z}$N second cladding layer 309. Thus, a refractive index waveguide structure can be easily realized.

EXAMPLE 4

FIGS. 16A and 16B show a method for fabricating a semiconductor laser according to the present invention.

Figure 17:
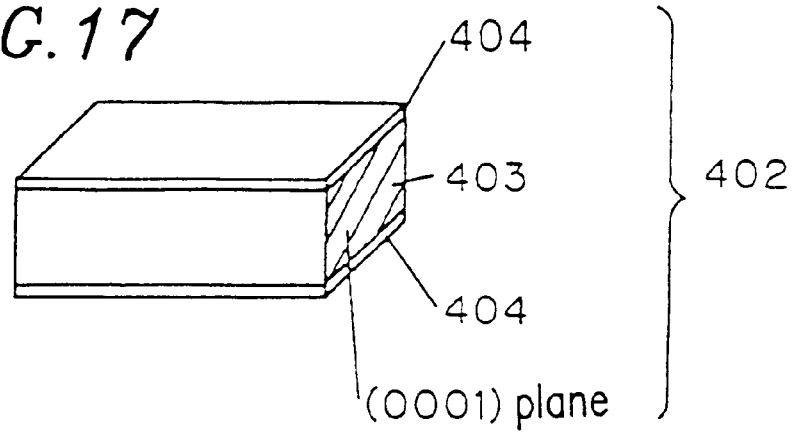
FIG. 17 shows a sub-mount for the semiconductor laser of Example 4.

As shown in FIG. 16A, a chip of a semiconductor laser 401 which was fabricated by forming an Al$_x$Ga$_y$In$_z$N ($0 \leq x \leq 1$, $0 \leq y \leq 1$, $0 \leq z \leq 1$) layer on the (0001) plane of a sapphire substrate by a crystal growth method such as MOVPE is mounted on a sub-mount 402 at a high temperature of 200° C. As shown in FIG. 17, the sub-mount 402 includes an LiTaO$_3$ dielectric 403 of anisotropic crystal and a solder member 404. The semiconductor laser 401 is mounted on a plane perpendicular to the (0001) plane, for example, on the (11$\bar{2}$0) or (1100) plane.

The solder member 404 is composed of Pb—Sn and the like, for example. The solder member melted at 200° C. is solidified when the temperature lowers to room temperature, so that the semiconductor laser 401 is secured to the sub-mount 402. The thermal expansion coefficient of the LiTaO$_3$ dielectric 403 is $22\times10^{-6}$/K in the a-axis direction and $1.2\times10^{-6}$/K in the c-axis direction. That is, the thermal expansions in the x-axis direction and the y-axis direction shown in FIG. 16A are considerably different from each other. As a result, non-uniform stress is applied to the semiconductor laser 401 when the semiconductor laser 401 is secured to the sub-mount 402. The amount of the uniaxial stress applied to the semiconductor laser 401 can be controlled by adjusting the temperature to be increased. In other words, larger stress can be applied as the temperature is higher.

The semiconductor laser 401 of this example uses wurtzite-type crystal, which can change the band structure of the valence band by applying uniaxial stress in a direction vertical to the (0001) axis. This reduces the effective mass and thus the state density. As a result, a highly reliable semiconductor laser with reduced threshold current and driving current can be obtained.

Thus, the characteristics of the semiconductor light emitting element can be greatly improved by combining the wurtzite-type semiconductor light emitting element with anisotropic crystal of which thermal expansion coefficient varies depending on the direction.

In this example, the semiconductor laser 401 was mounted on a plane of the sub-mount vertical to the (0001) plane, for example, on the (1120) or (1100) plane. However, the plane direction is not limited to the above as long as the sub-mount can provide uniaxial stress.

EXAMPLE 5

Figure 18A:
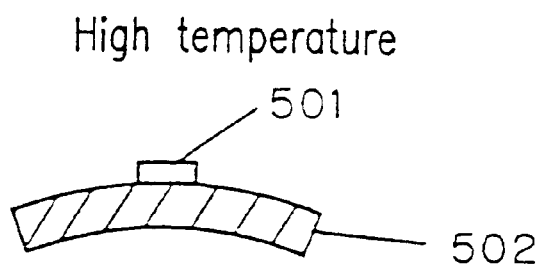
FIGS. 18A and 18B show a fabrication process of semiconductor laser of Example 5 according to the present invention.
Figure 18B:
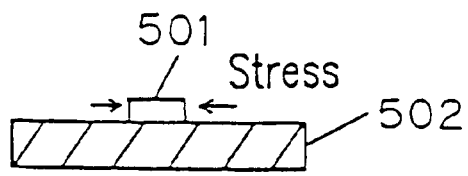

FIGS. 18A to 18B show another method for fabricating a semiconductor laser according to the present invention.

Figure 19:
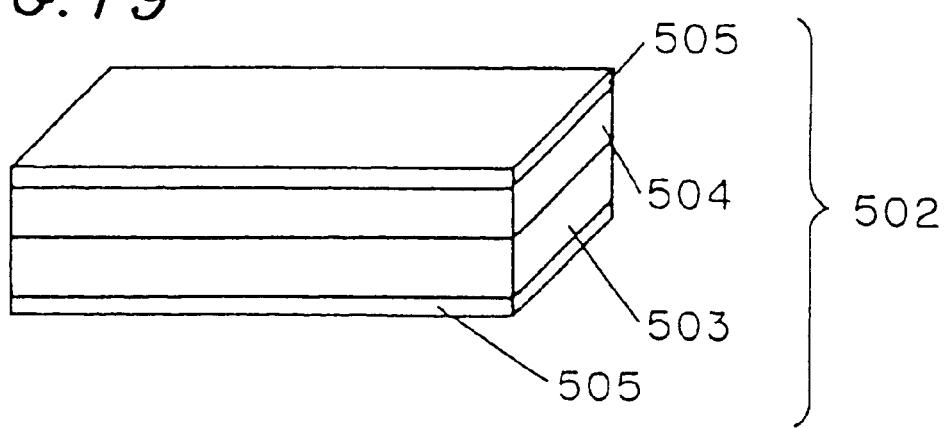
FIG. 19 shows a sub-mount for the semiconductor laser of Example 5.

As shown in FIG. 18A, a chip of a semiconductor laser 501 which was fabricated by forming an $Al_xGa_yIn_zN$ ($0 \leq x \leq 1$, $0 \leq y \leq 1$, $0 \leq z \leq 1$) layer on the (0001) plane of a sapphire substrate by a crystal growth method such as MOVPE is mounted on a sub-mount 502 at a high temperature of 180° C. As shown in FIG. 19, the sub-mount 502 includes an Fe—Ni alloy 503, an Fe—Ni—Mn alloy 504, and a Pb—Sn solder member 505. The Fe—Ni alloy which is called Invar hardly changes its length as the temperature changes. On the other hand, the Fe—Ni—Mn alloy exhibits significantly large thermal expansion as the temperature rises. A sub-mount which curves as the temperature changes can be obtained by laminating the Fe—Ni alloy 503 and the Fe—Ni—Mn alloy 504.

The solder member melted at 180° C. is solidified when the temperature lowers to room temperature, so that the semiconductor laser 501 is secured to the sub-mount 502. Non-uniform stress which is especially large in one direction is applied to the semiconductor laser 501 when the semiconductor laser 501 is secured to the sub-mount 502. The amount of the uniaxial stress applied to the semiconductor laser 501 can be controlled by adjusting the temperature to be increased.

The semiconductor laser 501 of this example uses the wurtzite-type crystal, which can change the structure of the valence band by receiving uniaxial stress in a direction vertical to the (0001) axis. This reduces the effective mass and thus the state density. As a result, a highly reliable semiconductor laser with reduced threshold current and driving current can be obtained.

Thus, the characteristics of the semiconductor light emitting element can be greatly improved by combining the wurtzite-type semiconductor light emitting element with the bimetal.

Figure 20A:
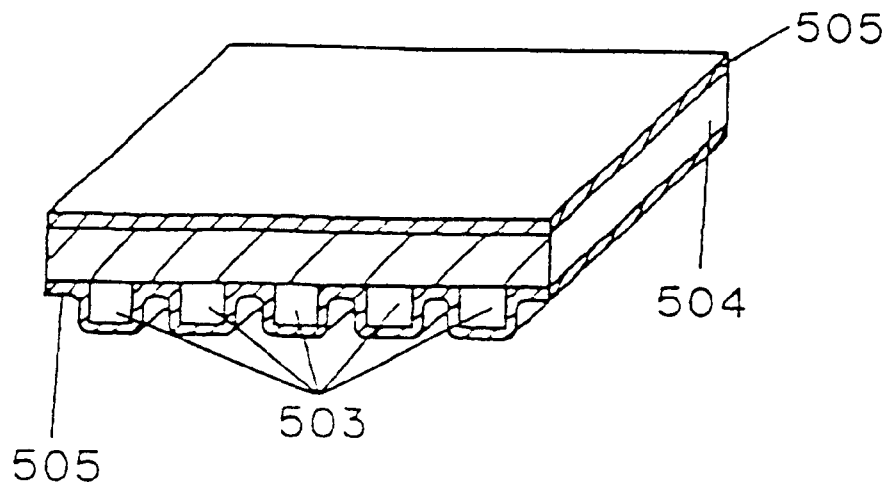
FIGS. 20A and 20B show another sub-mount for the semiconductor laser of Example 5.
Figure 20B:
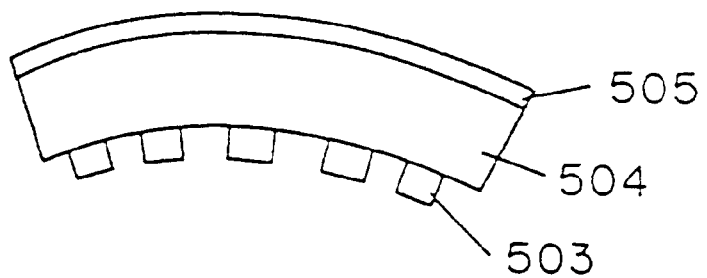

In this example, the sub-mount shown in FIG. 19 was used. Instead, the effect of the present invention can be obtained by using any sub-mount which can be curved in one direction. For example, the structure shown in FIGS. 20A and 20B can also be used. In this structure, a stripe-shaped Fe—Ni alloy 503 which does not expand with a temperature change, is formed on the bottom surface of an Fe—Ni—Mn alloy 504. The sub-mount of this structure can be curved in a direction vertical to the stripe direction as shown in FIG. 20B.

Figure 21:
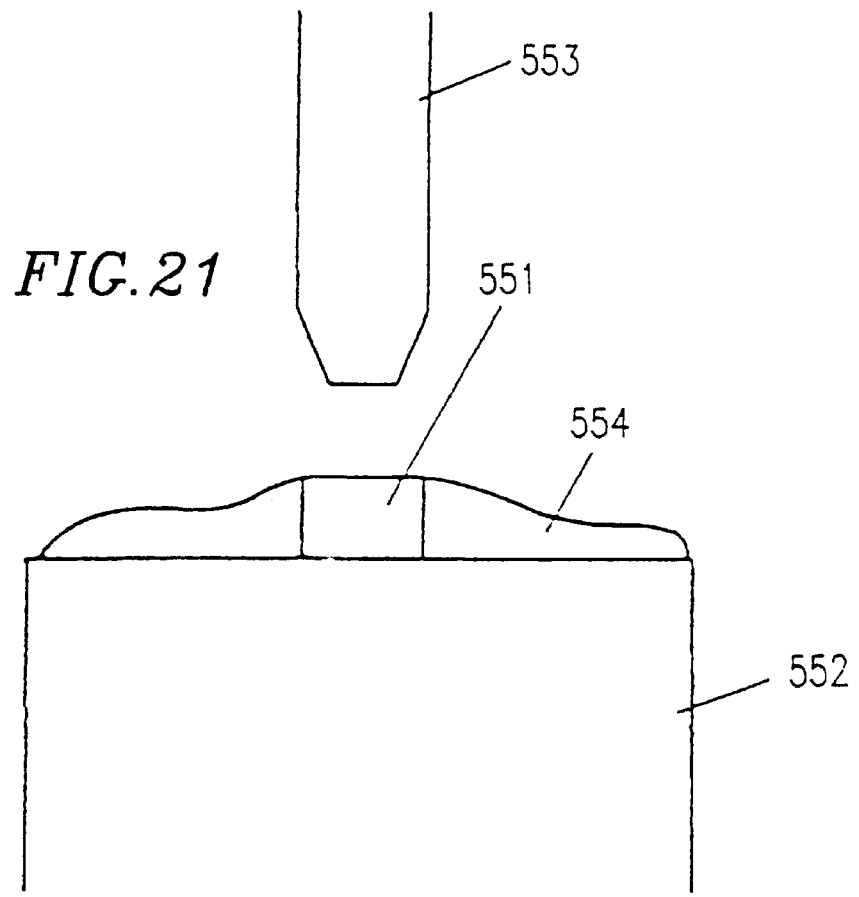
FIG. 21 is a sectional view showing a fabrication process of a semiconductor laser according to the present invention.

FIG. 21 shows another method for fabricating a semiconductor laser according to the present invention.

As shown in FIG. 21, a chip of a semiconductor laser 551 which was fabricated by forming an $Al_xGa_yIn_zN$ ($0 \leq x \leq 1$, $0 \leq y \leq 1$, $0 \leq z \leq 1$) layer on the (1120) plane of a sapphire substrate by a crystal growth method such as MOVPE is mounted on a sub-mount 552. Ultraviolet (UV)-curable resin 554 is formed on the sub-mount 552. Then, the semiconductor laser 551 is applied with stress from above by a collet 553, while the UV-curable resin 554 is irradiated with UV light, so as to secure the semiconductor laser 551 to the sub-mount 552. Vertical stress is applied to the semiconductor laser 551 when the semiconductor laser 551 is secured to the sub-mount 552.

The semiconductor laser 551 of this example uses the wurtzite-type crystal, which can change the structure of the valence band by receiving uniaxial stress in a direction vertical to the (0001) axis. This reduces the effective mass and thus the state density. As a result, a highly reliable semiconductor laser with reduced threshold current and driving current can be obtained.

Figure 22:
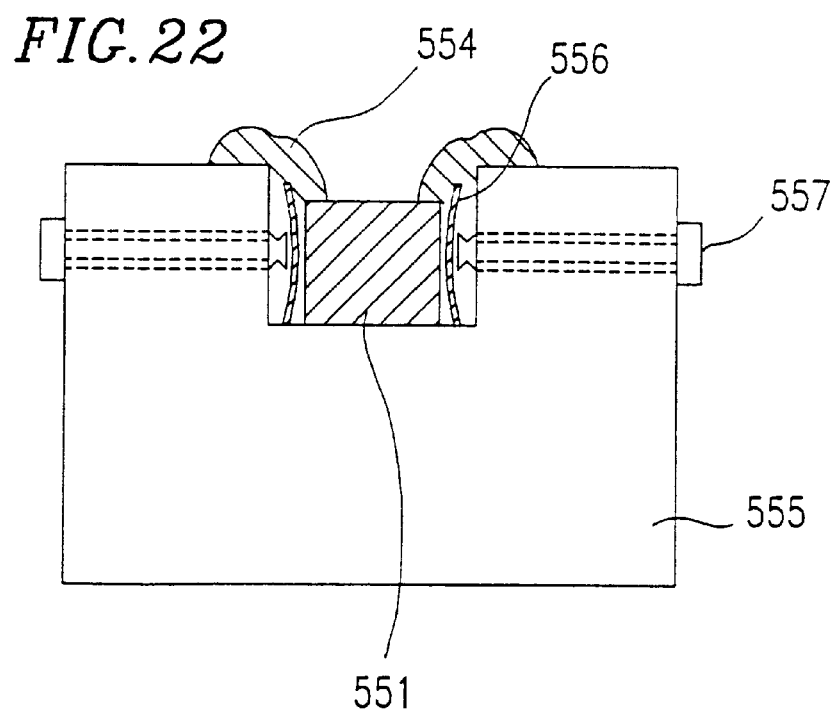
FIG. 22 is a sectional view showing another fabrication process of a semiconductor laser according to the present invention.

In the above alternative example, the stress was applied to the semiconductor laser from above as shown in FIG. 21. Instead, the stress can also be applied from the sides of the semiconductor laser as shown in FIG. 22. In this case, the semiconductor laser 551 is placed in a concave portion formed on a sub-mount 555. A hexagonal-system compound semiconductor is used for the active layer of the semiconductor laser, and the crystal is grown in the c-axis direction.

As shown in FIG. 22, screws 557 for applying stress to the sides of the semiconductor laser 551 via plate springs 556 are disposed on the sides of the sub-mount 555. The semiconductor laser 551 is secured to the concave portion with the UV-curable resin 554. By screwing the screws 557, uniaxial strain is generated in the c plane of the active layer of the semiconductor laser 551. With the uniaxial strain, a semiconductor laser with a small threshold current can be realized.

In the above alternative example, the semiconductor laser having the (1120) substrate was used. The effect of the present invention can be obtained for a structure where uniaxial stress is applied in a direction vertical to the (0001) plane.

The UV-curable resin was used in the above examples. Any other materials such as thermosetting resin can also be used as long as they can secure the semiconductor laser to the sub-mount.

EXAMPLE 6

Figure 23A:
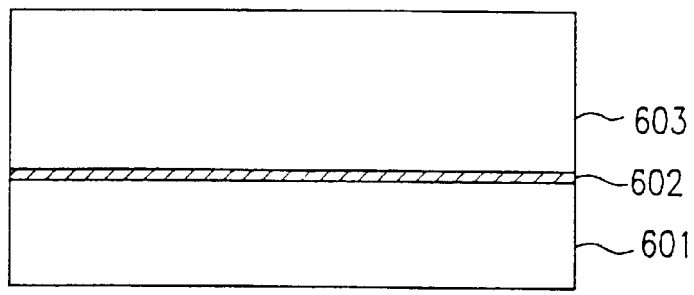
FIGS. 23A to 23C show a fabrication process of an AlGaInN semiconductor light emitting element of Example 6 according to the present invention.
Figure 23B:
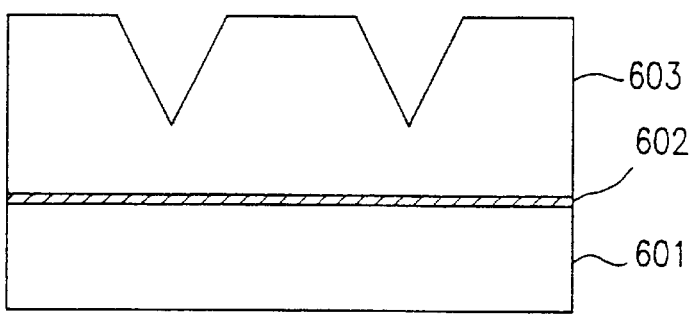
Figure 23C:
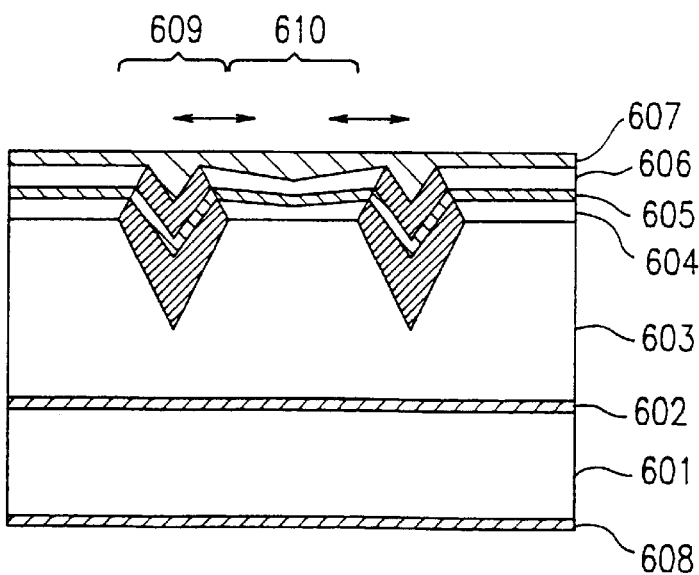

FIGS. 23A to 23C show a method for fabricating an AlGaInN semiconductor light emitting element according to the present invention.

The crystal growth in this method is conducted by low pressure MOVPE. Two MOVPE processes are required to fabricate the element. First, as shown in FIG. 23A, the first MOVPE process is conducted after degreasing a 6H-SiC substrate 601. The process will be described in detail.

Hydrogen gas is supplied in a reaction chamber of an MOVPE apparatus, and the pressure in the reaction chamber is set at $\frac{1}{10}$ atmospheric pressure. Then, the temperature of the substrate 601 is raised up to 1100° C. in the hydrogen gas atmosphere to clean the surface of the 6H-SiC substrate 601.

After the temperature of the substrate 601 is lowered to 600° C., ammonia gas as the V-group material and, after ten seconds, trimethyl aluminum as the III-group material, are supplied to a surface of the 6H-SiC substrate 601 so as to form a non-monocrystalline AlN layer 602 with a thickness of 50 nm. The supply of trimethyl aluminum is then stopped temporarily, in order to raise the substrate temperature to 900° C. Then, trimethyl aluminum as the III-group material is supplied again, so as to form a monocrystalline AlN layer 603 with a thickness of 5 μm.

Then, as shown in FIG. 23B, using SiO$_2$ as a mask for etching, two stripe grooves with a width of 3 μm are formed with a distance of 2 μm therebetween.

After removing the mask for etching, the second MOVPE process is conducted in the following manner. Hydrogen gas is supplied in the reaction chamber of the MOVPE apparatus, and the pressure in the reaction chamber is set at 1/10 atmospheric pressure. Then, the temperature of the 6H-SiC substrate 601 is raised to 1100° C. in an atmosphere which is a mixture of hydrogen gas and ammonia gas, so as to clean the surface of the substrate 601.

Then, as shown in FIG. 23C, after the temperature of the substrate 601 is lowered to 1030° C., trimethyl aluminum, trimethyl indium, and trimethyl gallium as the III-group materials are supplied, so as to form an Si-doped n-type AlGaInN cladding layer 604 with a thickness of 3 μm, an AlGaInN active layer 605 with a thickness of 20 nm, and an Mg-doped p-type AlGaInN cladding layer 606 with a thickness of 2 μm over the entire top surface of the AlN layer 603 including the inside of the stripe grooves consecutively in this order. Finally, a p-side electrode 607 and an n-side electrode 608 are formed to complete the laser structure.

At the formation of the double-hetero structure in the above fabrication process, the efficiency by which each of the III-group elements is introduced in the crystal in two stripe groove portions 609 is different from that in a flat portion 610 between the two stripe grooves. As a result, the composition varies, which corresponds to the variation in the lattice constant. Accordingly, transverse stress is applied from the stripe groove portions 609 to the flat portion 610 which is sandwiched by crystals of a different lattice constant. This indicates that strain can be selectively applied to the flat portion in a direction vertical to the stripe direction. This substantially corresponds to uniaxial strain in the plane of the active layer, which is effective in reducing the state density of the valence band. Also, the active layer in the flat portion 610 between the two stripe grooves is curved. Thus, a semiconductor laser with a low threshold current and a stable transverse mode can be realized by using the flat portion 610 as a light emitting portion.

The amount of strain applied to the flat portion 610 as the light emitting portion can be easily controlled by changing the distance between the two stripe grooves, the depth of the stripe grooves, and the thickness of the Si-doped n-type AlGaInN cladding layer 604.

EXAMPLE 7

Figure 24A:
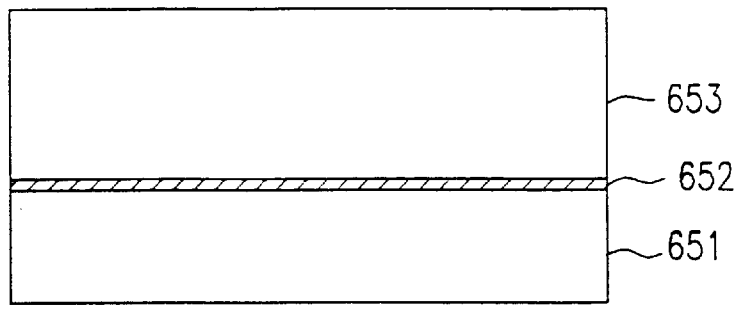
FIGS. 24A to 24C show a fabrication process of an AlGaInN semiconductor light emitting element of Example 7 according to the present invention.
Figure 24B:
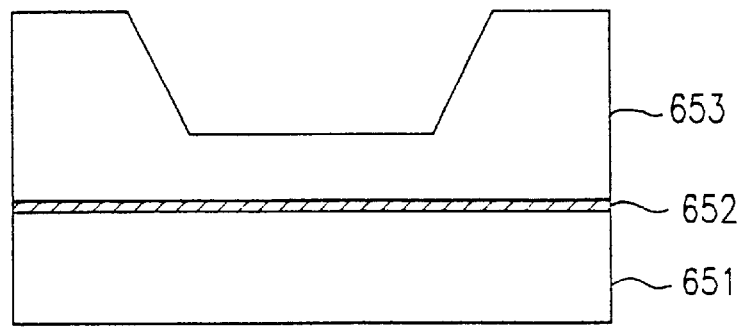
Figure 24C:
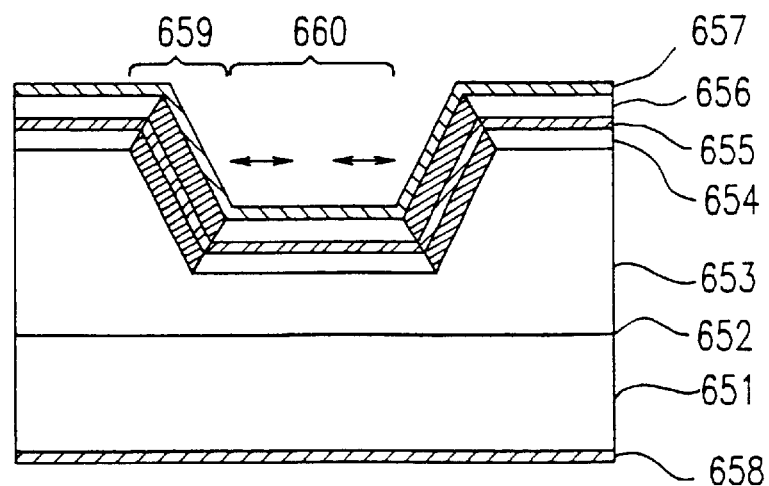

FIGS. 24A to 24C show another method for fabricating an AlGaInN semiconductor light emitting element according to the present invention. The method of this example is different from the method in Example 6 in that a concave portion is formed on a substrate instead of the two stripe grooves. Strain can be applied to an active layer of a flat portion on the bottom of the concave portion by using slope portions of the concave portion.

The crystal growth in this method is conducted by Vacuum MOVPE. Two MOVPE processes are required to fabricate the element. As shown in FIG. 24A, the first MOVPE process is conducted after degreasing a 6H-SiC substrate 651. The process will now be described in detail.

Hydrogen gas is supplied in a reaction chamber of an MOVPE apparatus, and the pressure in the reaction chamber is set at 1/10 atmospheric pressure. Then, the temperature of the substrate 651 is raised up to 1100° C. in the hydrogen gas atmosphere to clean the surface of the substrate 651. After the temperature of the substrate 651 is lowered to 600° C., ammonia gas as the V-group material and, after ten seconds, trimethyl aluminum as the III-group material are supplied to a surface of the 6H-SiC substrate 651, so as to form a non-monocrystalline AlN layer 652 with a thickness of 50 nm. The supply of trimethyl aluminum is then stopped temporarily, to raise the substrate temperature to 900° C. Then, trimethyl aluminum as the III-group material is supplied again, so as to form a monocrystalline AlN layer 653 with a thickness of 5 μm.

Then, as shown in FIG. 24B, using SiO$_2$ as a mask for etching, a stripe groove with a width of 3 μm is formed.

After removing the mask for etching, the second MOVPE process is conducted in the following manner. Hydrogen gas is supplied in the reaction chamber of the MOVPE apparatus, and the pressure in the reaction chamber is set at 1/10 atmospheric pressure. Then, the temperature of the 6H-SiC substrate 651 is raised up to 1100° C. in an atmosphere of mixture of hydrogen gas and ammonia gas, so as to clean the surface of the substrate 651.

Then, as shown in FIG. 24C, after the temperature of the substrate 651 is lowered to 1030° C., trimethyl aluminum, trimethyl indium, and trimethyl gallium as the III-group material are supplied, so as to form an Si-doped n-type AlGaInN cladding layer 654 with a thickness of 3 μm, an AlGaInN active layer 655 with a thickness of 20 nm, and an Mg-doped p-type AlGaInN cladding layer 656 with a thickness of 2 μm over the entire top surface of the AlN layer 653 including the inside of the stripe groove consecutively in this order. Finally, a p-side electrode 657 and an n-side electrode 658 are formed to complete the laser structure.

At the formation of the double-hetero structure in the above fabrication process, the efficiency by which each of the III-group elements is introduced in the crystal in stripe groove slope portions 659 is different from that in a stripe groove flat portion 660. As a result, the composition varies, which corresponds to the variation in the lattice constant. Accordingly, transverse stress is applied from the stripe groove slope portions 659 to the stripe groove flat portion 660 which is sandwiched by crystals of a different lattice constant. This indicates that strain can be selectively applied to the stripe groove flat portion 660 only in a direction vertical to the stripe direction. That is, uniaxial strain can be applied in the plane of the active layer of the stripe groove flat portion 660. Thus, a semiconductor laser with a low threshold current and a stable transverse mode can be realized by using the stripe groove flat portion 660 as a light emitting portion.

The amount of strain applied to the stripe groove flat portion 660 as the light emitting portion can be easily controlled by changing the width and depth of the stripe groove and the thickness of the Si-doped n-type AlGaInN cladding layer 654.

EXAMPLE 8

Figure 25A:
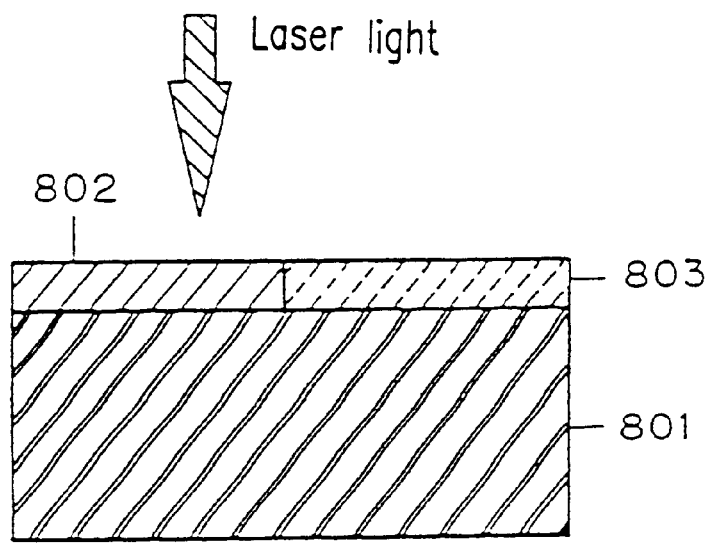
FIGS. 25A and 25B show a vapor phase epitaxy step including selective laser irradiation and the relationship between the lattice constant of GaN crystal grown by the vapor phase epitaxy and the selective laser irradiation, respectively, of Example 8.

Referring to FIG. 25A, GaN crystal layers 802 and 803 are formed on a (0001) sapphire substrate 801 by MOVPE using trimethyl gallium (TMG) and ammonia (NH$_3$). Hydrogen is used as a carrier gas. The growth pressure is 100 Torr. At the vapor phase epitaxy, a portion of the substrate is selectively irradiated with a light beam emitted from an excimer laser and the like through a window formed in a reaction chamber. The crystal growth is conducted at 500°

C., which is lower than the temperature at which monocrystal is normally obtained. This low temperature is necessary for forming the GaN crystal layers with different lattice constants arranged two-dimensionally.

Figure 25B:
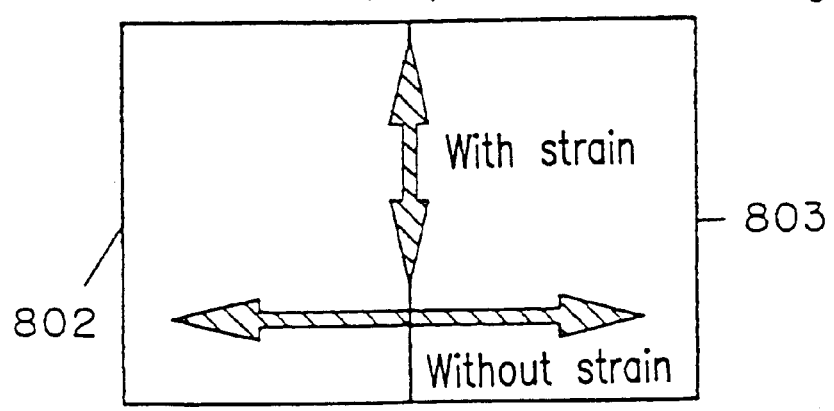
Figure 26:
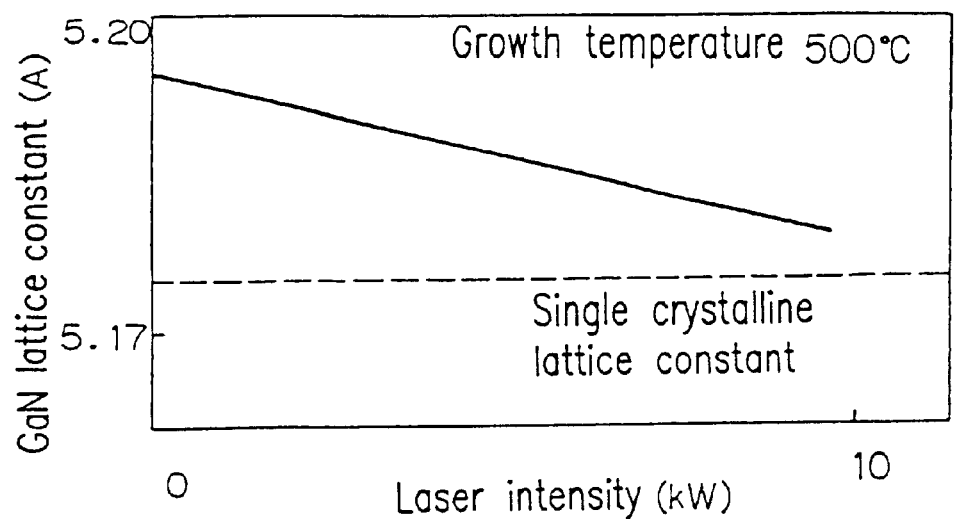
FIG. 26 shows the relationship between the laser irradiation intensity and the GaN lattice constant.

FIG. 26 shows data by which the inventors have found that the lattice constant of GaN crystal varies depending on the intensity of a laser beam radiated during vapor phase epitaxy. This is considered to occur due to the following reason: When the growth temperature is sufficiently low, resultant GaN crystal is polycrystalline, which has a small apparent lattice constant. If a laser beam with high intensity is radiated during the crystal growth, the temperature of the irradiated portion selectively increases, resulting in monocrystalizing the irradiated portion. Referring to FIG. 25A, the (0001) sapphire substrate 801 is selectively irradiated with an excimer laser beam with an intensity of 10 kW during the MOVPE process. As a result, the GaN crystal layer 802 having a lattice constant normally obtained for monocrystal is formed in the laser beam irradiated region. On the other hand, the polycrystalline GaN crystal layer 803 having a larger lattice constant is formed in the region which is not irradiated with a laser beam. As a result, as shown in FIG. 25B, a two-dimensionally anisotropic strain state is realized in the boundary area of the GaN crystal layers 802 and 803, where strain is generated along the boundary and no strain is generated in a direction perpendicular to the boundary. If this is applied to an active layer of a gallium nitride semiconductor laser, for example, significant improvement on characteristics thereof is expected. The growth temperature is not limited to 500° C., but a similar effect can be obtained by 700° C. or less at which polycrystal is obtained.

EXAMPLE 9

Figure 27:
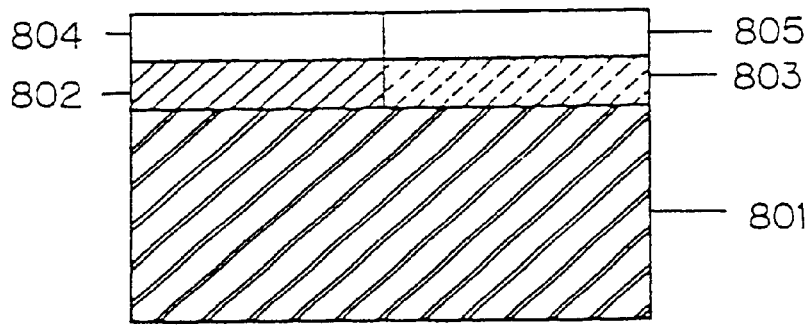
FIG. 27 shows a vapor phase epitaxy step including selective laser irradiation of Example 10.

In this example, GaN is further deposited on the GaN crystal layers 802 and 803 of Example 8 by MOVPE at 1000° C. without irradiation with a laser beam. As a result, a GaN crystal layer 805 in FIG. 27 formed on the polycrystalline GaN crystal layer 803 has a large lattice constant, while a GaN crystal layer 804 formed on the monocrystalline GaN crystal layer 802 has a small lattice constant. Important is that the temperature for this crystal growth should be higher than the temperature at which the GaN crystal layers 802 and 803 were formed. Using the polycrystalline GaN crystal layer 803 having a large lattice constant as a buffer layer, the GaN crystal layer 805 which is more monocrystalline and has good crystallinity can be formed. As a result, a GaN monocrystal layer with higher quality than that obtained by the method only including laser beam irradiation as shown in FIG. 25A can be realized.

EXAMPLE 10

Information on lattice mismatching from the sapphire substrate can be controlled by varying the thickness of the GaN crystal layers 802 and 803 shown in FIG. 25A. Accordingly, by varying the thickness of the GaN crystal layers 802 and 803, the lattice constant of the GaN crystal layer 805 can be varied and thus the amount of strain can be controlled. By using the GaN monocrystal layer having two-dimensional strain fabricated by the above method as an active layer of a gallium nitride semiconductor laser, significant improvement on characteristics thereof is expected.

In the above examples, the growth of GaN monocrystal was described. A similar effect can also be obtained by using AlN, InN, or a mixture thereof. Also, a similar effect can be obtained by using a substrate made of SiC, ZnO, and the like, instead of the sapphire substrate described above.

EXAMPLE 11

FIGS. 28A to 28D show a fabrication process of Example 11 according to the present invention. A sapphire substrate 1101 is placed in a reaction chamber of an MOVPE apparatus and heated to 1000° C. Then, the following layers are formed by MOVPE by supplying respective materials in the reaction chamber so as to form a double-hetero structure: an AlGaN cladding layer 1102 with a thickness of 5 μm by supplying hydrogen, ammonia, trimethyl aluminum, and trimethyl gallium; an n-type AlGaInN cladding layer 1103 with a thickness of 5 μm by supplying hydrogen, ammonia, trimethyl aluminum, trimethyl indium, and trimethyl gallium; an InGaN active layer 1104 with a thickness of 0.01 μm by supplying hydrogen, ammonia, trimethyl indium, and trimethyl gallium; and a p-type AlGaInN cladding layer 1105 with a thickness of 2 μm by supplying hydrogen, ammonia, trimethyl aluminum, trimethyl indium, trimethyl gallium, and diethyl zinc.

The AlInGaN cladding layers 1103 and 1105 and the InGaN active layer 1104 have lattice constants larger than that of the AlGaN cladding layer 1102. Accordingly, compression strain is generated in the resultant structure.

Figure 28A:
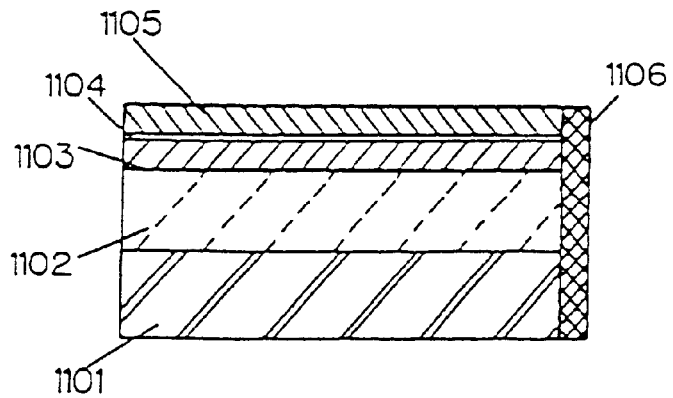
FIGS. 28A to 28D are sectional views showing a fabrication process of a semiconductor device of Example 11 according to the present invention.

Then, as shown in FIG. 28A, an insulating film 1106 is formed over the sides of the substrate 1101 and the layers 1102 to 1105 by thermal CVD.

Figure 28B:
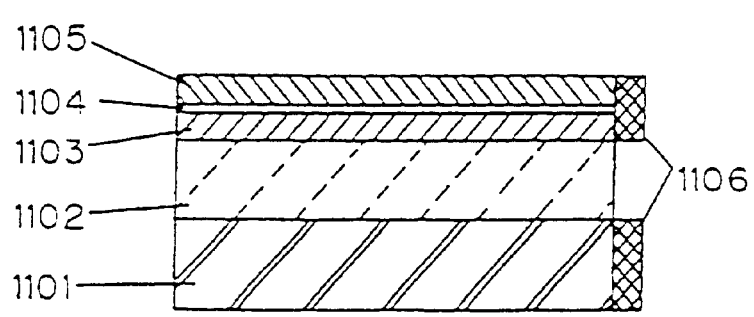

The insulating film 1106 is selectively etched by photolithography and reactive ion etching with carbon tetrafluoride so that the side face of the AlGaN cladding layer 1102 is exposed as shown in FIG. 28B.

Figure 28C:
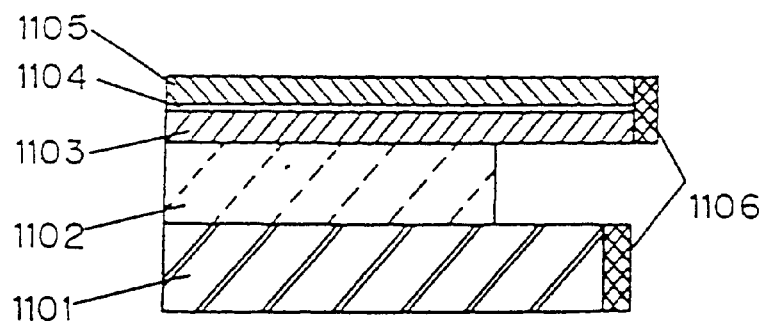

The AlGaN cladding layer 1102 is then etched from the exposed side face by 5 μm by reactive ion beam etching with chlorine, forming the structure as shown in FIG. 28C. The AlGaInN cladding layer 1103, the InGaN active layer 1104, and the AlGaInN cladding layer 1105 have lattice constants larger than the AlGaN cladding layer 1102 because the former contain indium. Accordingly, the lattice constants of these layers are reduced from their original values and compression strain is generated in the portion of these layers where the AlGaN cladding layer 1102 exists underneath. On the contrary, in the other portion of these layers where the AlGaN cladding layer 1102 has been removed by etching, no stress is applied and thus their original lattice constants remain. In FIG. 28C, therefore, these layers 1103 to 1105 are shown as expanding in the longitudinal direction.

Figure 29:
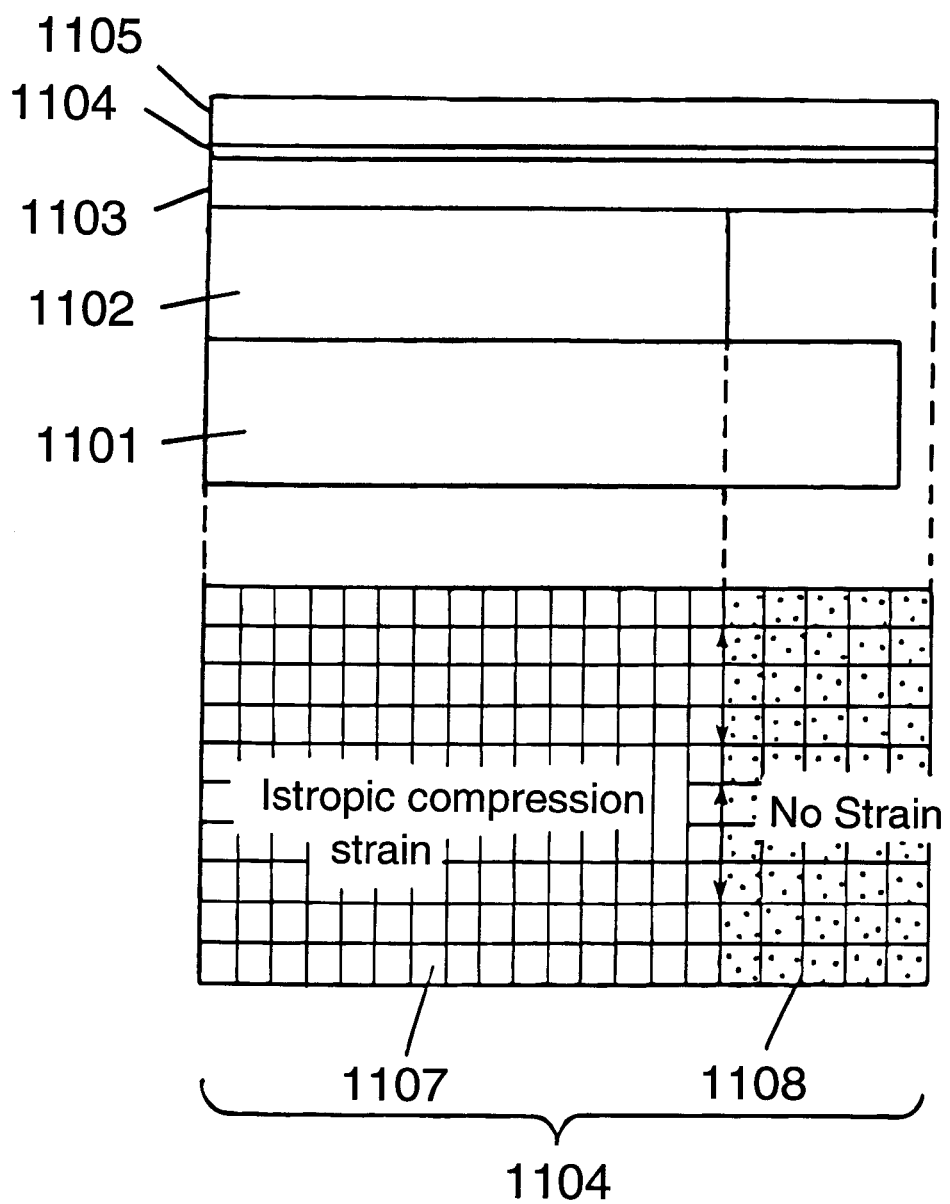
FIG. 29 is a schematic sectional view of the semiconductor device of Example 11, together with a crystal structure of an active layer of the semiconductor device.

FIG. 29 shows a sectional view of the structure after removing the insulating film, together with a plane view thereof as is viewed from above. Regions 1107 and 1108 schematically show the lattice constants of crystals of the InGaN active layer 1104 as is viewed from above. The region 1107 of the InGaN active layer 1104 is located above the AlGaN cladding layer 1102 having a lattice constant smaller than that of the active layer. Accordingly, the region 1107 of the InGaN active layer 1104 receives stress from all the directions vertical to the growth direction, generating two-dimensional compression strain. The region 1107 expands in the growth direction by receiving the compression strain.

The region 1108 of the InGaN active layer 1104 below which the AlGaN cladding layer 1102 does not exist receives no stress in the right direction as is seen from FIG. 29 among the directions vertical to the growth direction. Accordingly, it is possible to apply compression strain in a selective direction.

Thus, strain in directions shown by arrows in FIG. 29 is generated in the active layer 1104 at the boundary of the region 1107 below which the AlGaN cladding layer 1102 exists and the region 1108 below which the layer 1102 does not exist. This strain corresponds to uniaxial strain in the plane, reducing the state density of the valence band. In the region 1107, the active layer 1104 receives compression strain isotropically in the plane. This strain is therefore not effective in reducing the threshold current. However, anisotropic strain is generated at the boundary of the regions 1107 and 1108, which is greatly effective in reducing the threshold current.

Figure 28D:
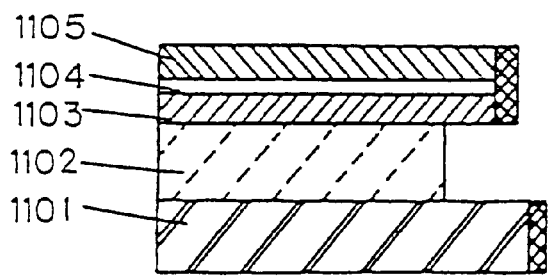

Alternatively, as shown in FIG. 28D, an InGaN cladding layer can be used instead of the AlGaN cladding layer 1102, and an AlGaInN active layer can be used instead of the InGaN active layer 1104. In this alternative example, also, tensile strain can be selectively applied to the AlGaInN active layer at the boundary of the portion below which the InGaN cladding layer exists and the portion below which the cladding layer does not exist in a manner as described above.

The selective etching can be conducted by electrolysis, instead of the patterning of the insulating film and the dry etching such as reactive ion beam etching as described above. In the etching by electrolysis, a layer to be etched is doped with impurities with high concentration so as to be etched faster than other layers, and a voltage is applied via electrodes in an electrolytic solution. An insulating layer with a thickness of about 1 $\mu$m is required between the layer to be etched and other layers constituting the device structure to prevent electrical interference.

EXAMPLE 12

Figure 30A:
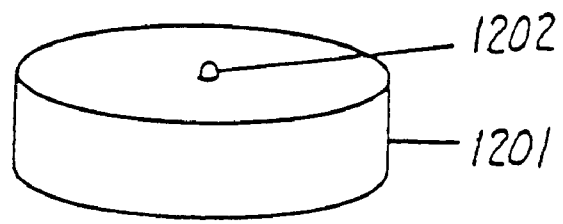
FIGS. 30A to 30C schematically show a fabrication process of a semiconductor device of Example 12 according to the present invention.
Figure 30B:
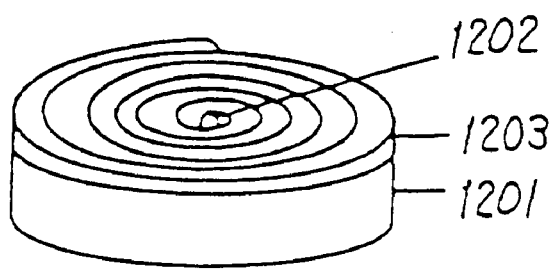
Figure 30C:
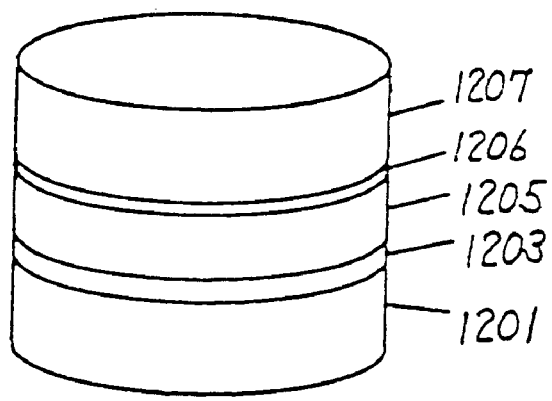

FIGS. 30A to 30C schematically show a fabrication process of Example 12 according to the present invention. A sapphire substrate 1201 is placed in a reaction chamber of an MOVPE apparatus and heated to 1000° C. Hydrogen, ammonia, and trimethyl gallium are supplied in the reaction chamber so as to form a GaN crystal nucleus 1202 on the substrate 1201. At this time, the pressure in the reaction chamber is set as low as 10 Torr in order to obtain a low density for the formation of the growth nucleus.

Then, while the pressure is further lowered to 5 Torr, ammonia and trimethyl gallium are supplied to grow GaN crystal 1203. This extremely low pressure prevents a new crystal nucleus from being formed on the substrate and the crystal from being deposited vertically to the substrate. This is the condition where monocrystal is most easily deposited on a crystal wall. Thus, the GaN crystal 1203 is grown around the crystal nucleus 1202 spirally in parallel to the substrate, forming a spiral thin film.

Figure 31:
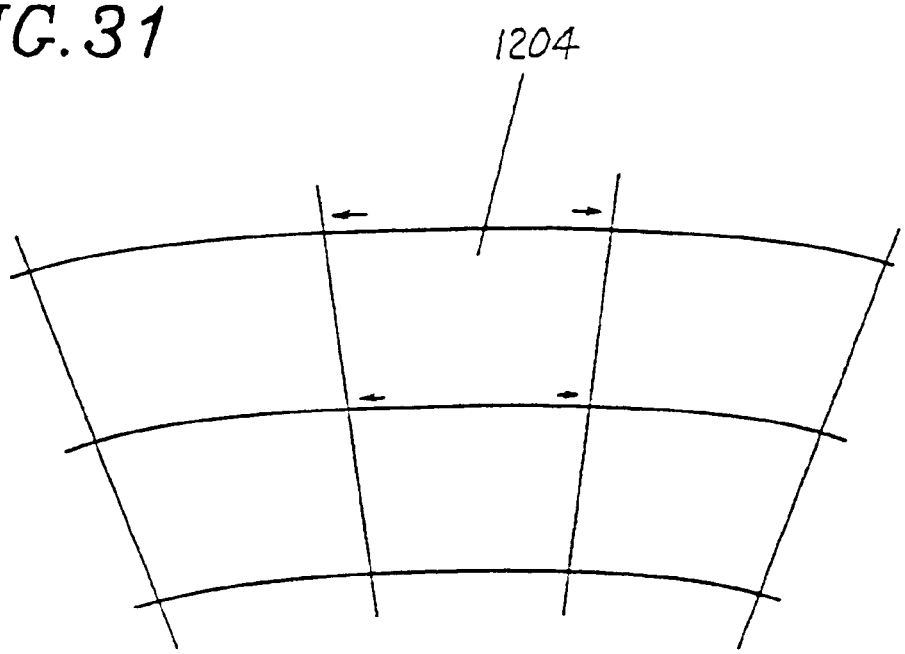
FIG. 31 schematically shows a unit cell of a GaN spiral thin film of Example 12.

FIG. 31 schematically shows a unit cell 1204 of the GaN crystal 1203. The unit cell 1204 does not receive stress in the radial direction, but receives a tensile stress in the circumferential direction which is stronger as the portion thereof is closer to the outer circumference of the substrate. Accordingly, as long as dislocation does not occur, the GaN crystal 1203 is a crystal having asymmetric strain (anisotropic strain) where tensile strain is generated only in the circumferential direction.

Thereafter, the pressure in the reaction chamber is raised to 80 Torr, to allow crystal to be deposited vertically to the substrate. Hydrogen, ammonia, trimethyl aluminum, and trimethyl gallium are supplied onto the GaN spiral thin film 1203, so as to form an n-type AlGaN cladding layer 1205 with a thickness of 5 $\mu$m. Likewise, an InGaN active layer 1206 with a thickness of 0.01 $\mu$m is formed by supplying hydrogen, ammonia, trimethyl indium, and trimethyl gallium, and a p-type AlGaN cladding layer 1207 with a thickness of 2 $\mu$m is formed by supplying hydrogen, ammonia, trimethyl aluminum, trimethyl gallium, and diethyl zinc. Thus, as shown in FIG. 30C, a double hetero structure is formed.

According to the method of this example, crystal with asymmetric strain can be easily formed only by varying the pressure in the crystal growth process without the necessity of the steps such as etching and selective re-growth. As a result, a semiconductor laser with a small threshold current can be obtained by this method.

EXAMPLE 13

Figure 34:
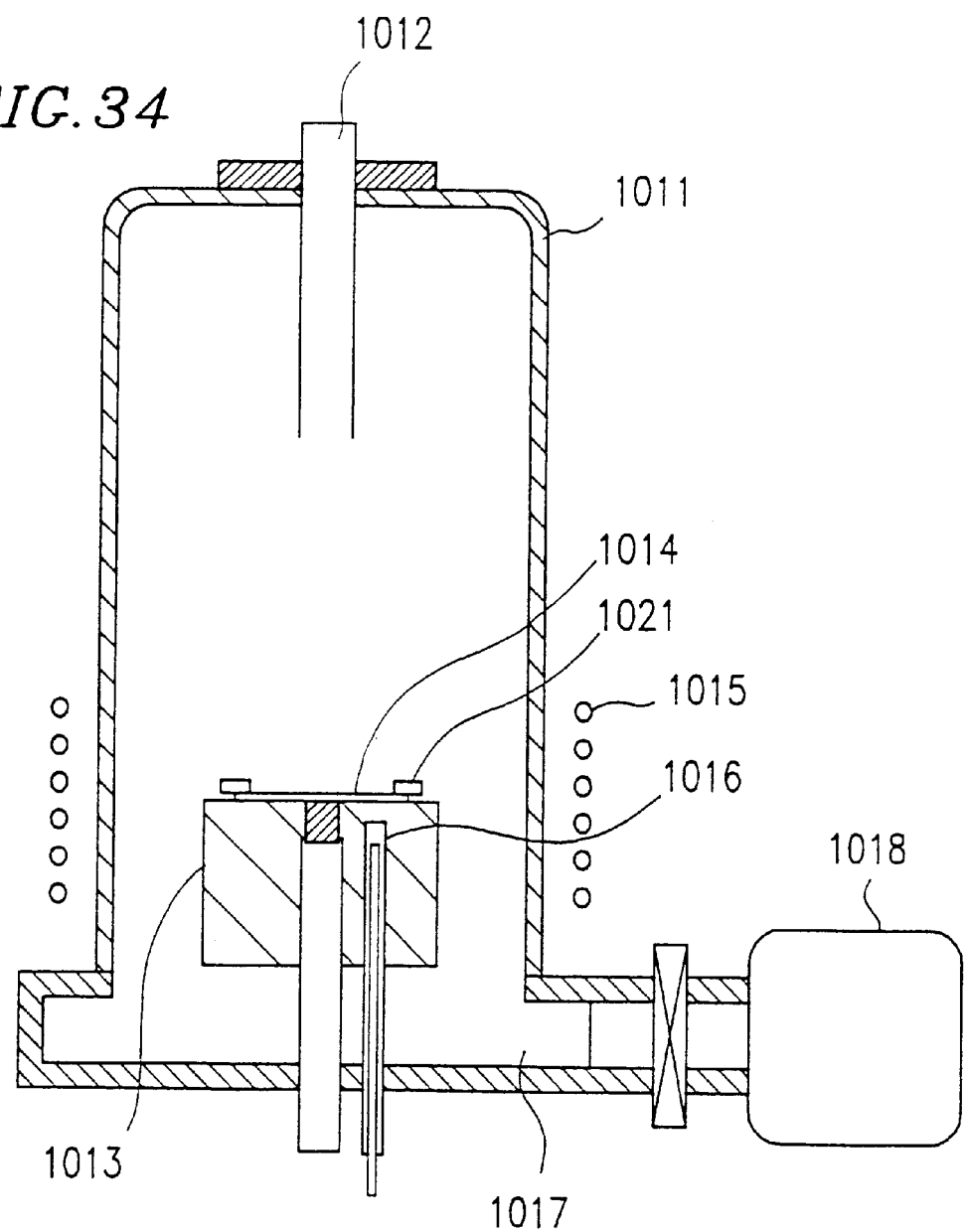
FIG. 34 is a sectional view of a crystal growth apparatus used in Example 13 according to the present invention.

FIG. 34 is a schematic sectional view of a crystal growth apparatus used in this example. Material gas is supplied from a gas inlet 1012 into a reaction chamber 1011 made of quartz. A susceptor 1013 made of carbon is placed in the reaction chamber 1011, on which a sample substrate 1014 is mounted. The susceptor 1013 is provided with a rotational mechanism for securing the in-plane uniformity of the composition and pressure of an epitaxial layer. The susceptor 1013 is heated by induction with a high frequency coil 1015 disposed around the reaction chamber 1011. A thermocouple 1016 is disposed inside the susceptor 1013 for monitoring and controlling the temperature of the substrate. A gas outlet 1017, which is connected to a vacuum pump 1018, regulates the pressure in the reaction chamber and exhausts gas outside.

A crystal growth method using the above apparatus will be described with reference to FIGS. 34 and 35A to 35D. First, a (0001) plane $\alpha$-Al$_2$O$_3$ sapphire substrate 1031 of which surface has been cleaned with chemical treatment with an organic solvent and a hydrochloric acid group substance and by washing with pure water is mounted on the susceptor 1013 and secured thereto with a holder 1021. High-purity hydrogen gas purified by a purifying apparatus is supplied from the gas inlet 1012 and replaces air in the reaction chamber 1011. After the supply of the hydrogen gas for several minutes, the vacuum pump 1018 is driven to set the pressure in the reaction chamber at 10 Torr. Following the stabilization of the pressure, the susceptor 1013 is heated by induction with the high frequency coil 1015, so as to raise the temperature of the sample substrate 1014 to 1200° C. This temperature is kept for about 10 minutes, to clean the surface of the substrate.

Figure 35A:
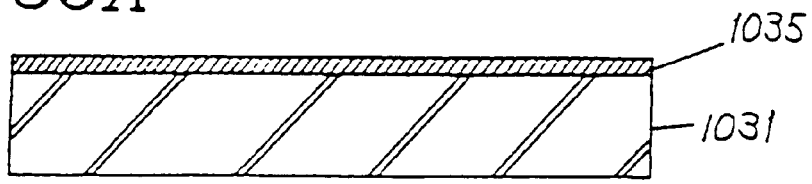
FIGS. 35A to 35D are sectional views showing a crystal growth process in Example 13.

The temperature of the substrate is lowered to 400° C. Then, TMG (trimethyl gallium) and NH$_3$ (ammonia) as the material gas are supplied from the gas inlet 1012, so as to form an amorphous GaN film 1035 with a thickness of 0.1 $\mu$m as shown in FIG. 35A. At this time, since the substrate temperature is low compared with a normal growth condition, the decomposition efficiency of NH$_3$ is low. In consideration of this, the flow rate ratio of NH$_3$ to TMG is set at 10000:1. If the substrate temperature at the crystal growth is higher than the above temperature, crystal grows three-dimensionally, i.e., hexagonpole shaped crystals are grown like islands, failing in obtaining a uniform amorphous GaN film.

Figure 35B:
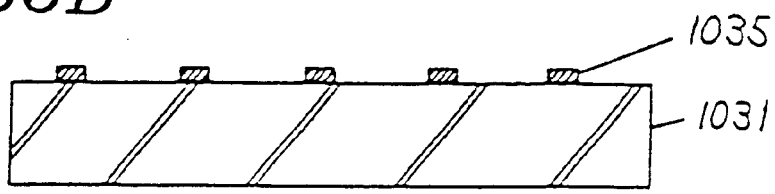

The sample substrate is taken out from the reaction chamber 1011 after the temperature thereof is lowered. The amorphous GaN film 1035 is then etched by photolithography to form stripes in a direction crossing the R plane of the sapphire substrate 1031 as shown in FIG. 35B. The R plane of the sapphire substrate 1031 is a plane shown as the section in FIGS. 35A to 35D. The stripes extend in a direction vertical to the plane of these figures, i.e., crossing the R plane. The width of the stripes and the distance between the stripes are 5 $\mu$m and 50 $\mu$m, respectively.

The sample substrate 1014 is placed again in the reaction chamber 1011 after being washed sufficiently with pure water. $NH_3$ gas is supplied in the reaction chamber this time, instead of hydrogen gas, and the sample substrate 1014 is heated to 1100° C. as in the manner described above, so as to clean the surface of the sample substrate.

Figure 35C:
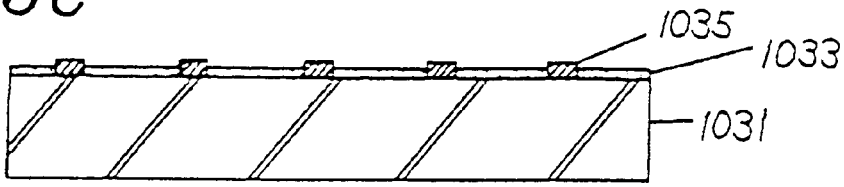
Figure 35D:
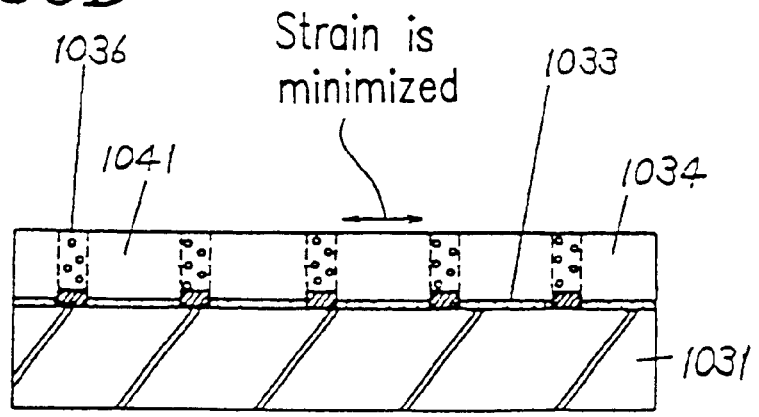

Then, GaN films are formed by a normal two-stage epitaxy by supplying TMG and $NH_3$ from the gas inlet 1012. More specifically, first, the substrate temperature is lowered to 600° C. to facilitate a GaN film 1033 with a thickness of 0.05 μm to be formed three-dimensionally, i.e., hexagon-pole shaped crystals to be grown like islands as shown in FIG. 35C. Then, the substrate temperature is raised to 1050° C. to form a GaN film 1034 with a thickness of 5.0 μm by epitaxy as shown in FIG. 35D. The flow rate ratio of $NH_3$ to TMG is 300:1. The portions of the GaN film 1034 formed on the stripes of the amorphous GaN film 1035 are amorphous because only amorphous crystal is grown on an amorphous crystal. The amorphous portions of the GaN film 1034 are specifically called amorphous GaN films 1036.

The other portions of the GaN film 1034 interposed between the amorphous GaN films 1036 constitute element formation regions 1041. In these regions, the dislocation density is low and the strain in the crystal is anisotropic. In other words, strain caused by the difference in the lattice constant between the substrate 1031 and the GaN film 1034 is maintained in a direction parallel to the stripes, while it is minimized in a direction perpendicular to the stripes.

Thus, if a semiconductor laser, for example, is formed in the element formation region 1041 having anisotropic strain, the threshold current thereof can be reduced due to the anisotropic strain in the region.

Figure 36:
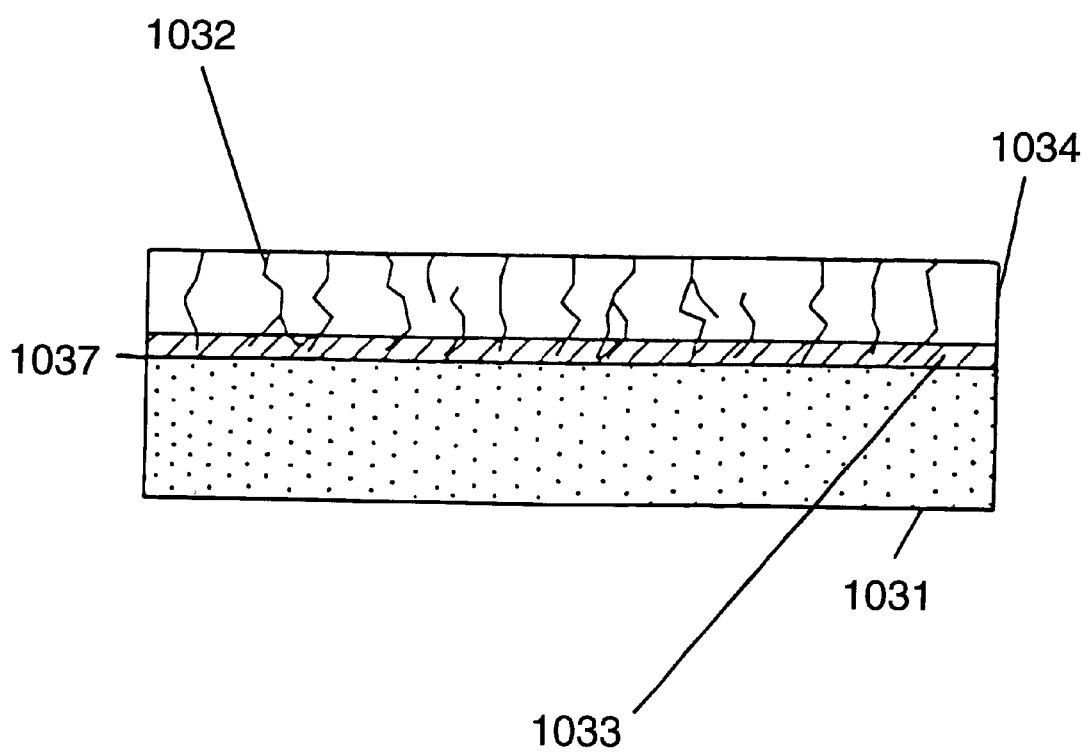
FIG. 36 is a sectional view of epitaxial layers formed by two-stage epitaxy as a comparative example.

Now, the crystal quality of the epitaxial layers obtained by this example will be described. For comparison, FIG. 36 shows a sectional view of GaN epitaxial layers 1033 and 1034 with a thickness of 5 μm formed on a (0001) plane α-$Al_2O_3$ sapphire substrate 1031 by a conventional two-stage epitaxial method. This exhibits a distribution of dislocation observed by a transmission electron microscope. Dislocations 1032 generated uniformly due to strain caused by lattice mismatching extend from an interface 1037 between the substrate 1031 and the GaN epitaxial layer 1033 toward the surface of the epitaxial layers while meandering. The dislocations which disappear or come out midway show that they extend in the direction vertical to the plane of the figure, not indicating that they are distinguished. The dislocation density estimated from the image obtained by the transmission electron microscope is $10^9/cm^2$ or more, and the distribution is uniform. The lattice strain applied to the epitaxial layers is isotropic in the plane.

Figure 37:
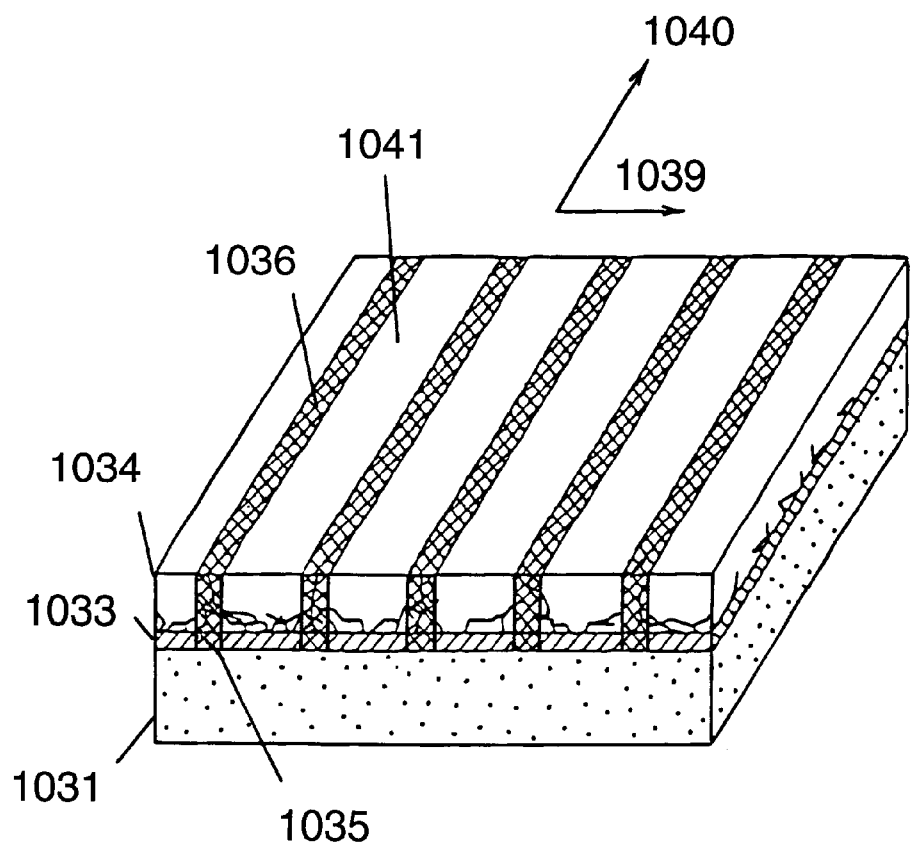
FIG. 37 is a perspective view of epitaxial layers in Example 13.

The epitaxially formed GaN films of this example will now be described with reference to FIG. 37. The distribution of dislocations observed by the transmission electron microscope is also shown in FIG. 37 schematically. It is observed from FIG. 37 that a considerably large number of dislocations reach the portions above the stripes of the amorphous GaN film 1035 where crystal defects are concentrated. This occurs within the region of the GaN films with a thickness of 3 μm. In other words, while strain is minimized in a direction 1039 vertical to the stripes, strain tends to remain in the crystal in a direction 1040 parallel to the stripes. As a result, epitaxial films where strain due to lattice mismatching is mostly remained in the direction 1040 parallel to the stripes are obtained.

Other effects are as follows. The dislocation density of the element formation regions 1041 interposed between the stripes is $10^5/cm^2$ or less. This indicates that the GaN films in these regions have excellent crystallinity compared with the comparative example shown in FIG. 36. Also, the strain in the direction parallel to the stripes is differently generated from that in the direction vertical to the stripes. That is, the element formation regions 1041 have anisotropic strain.

In this example, the stripes of the amorphous GaN film 1035 were formed on the substrate. A similar effect can also be obtained by using oxide films and nitride films such as $SiO_2$ and SiN.

Figure 38:
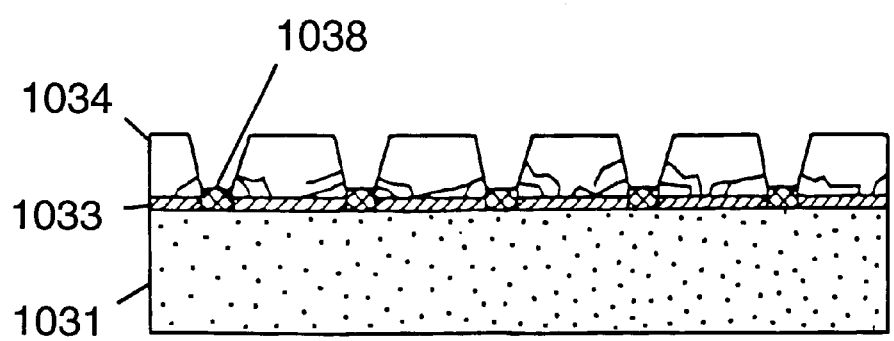
FIG. 38 is a sectional view of epitaxial layers in the case of using an $SiO_2$ film in Example 13.

FIG. 38 shows the case of using an $SiO_2$ film. GaN films 1033 and 1034 are selectively formed on a substrate on which strips of an $SiO_2$ film 1038 with a thickness of 0.1 μm have been formed. In this case, as in the above case, epitaxial films where strain due to lattice mismatching mostly remains in a direction parallel to the stripes are obtained. Since the GaN films are not formed on the stripes of the $SiO_2$ film (selective growth), the GaN films are formed like islands. In the island-like GaN film 1034, strain remains in the direction parallel to the stripes while being minimized in the direction vertical to the stripes, realizing anisotropic strain.

In this example, the GaN epitaxy on the (0001) plane α-$Al_2O_3$ sapphire substrate was described. The present invention is not limited to the above case, but can be applied to any epitaxy causing lattice mismatching, providing effects similar to the above.

In this example, a plurality of stripes of the GaN film 1035 were formed. However, with at least one stripe, anisotropic strain can be generated in the element formation region of the GaN film. This is because anisotropic strain always exists near the stripe.

The two-stage epitaxial method was used to form the GaN films on the substrate. However, the GaN film 1034 may be directly formed on the substrate without forming the GaN film 1033.

Thus, it has been verified that, in the epitaxy causing lattice mismatching, the method according to the present invention is effective in obtaining an epitaxial film where lattice strain generated due to the lattice mismatching can be concentrated in a specific direction.

EXAMPLE 14

Figure 32B:
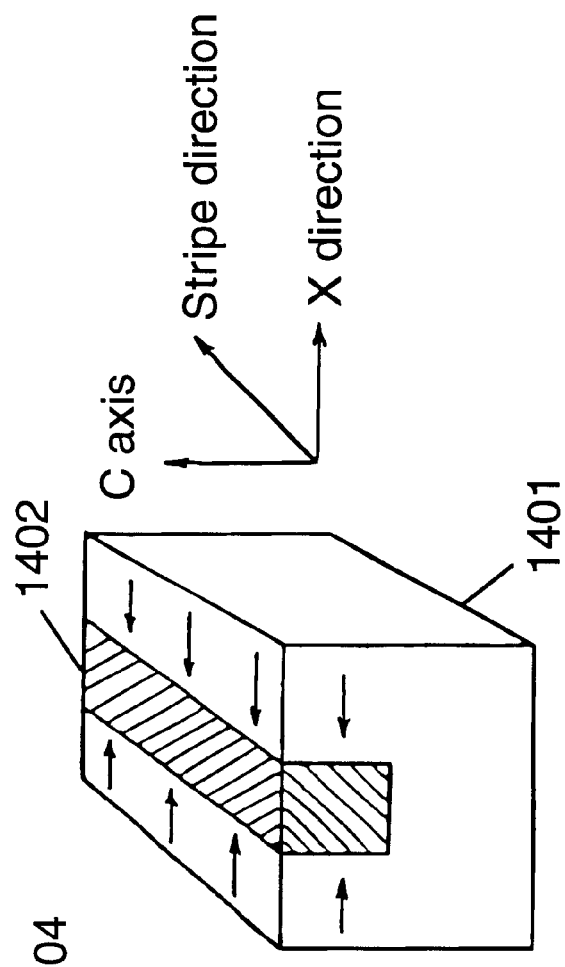
FIGS. 32A and 32B are perspective views of a semiconductor light emitting device of Example 14 according to the present invention.
Figure 32A:
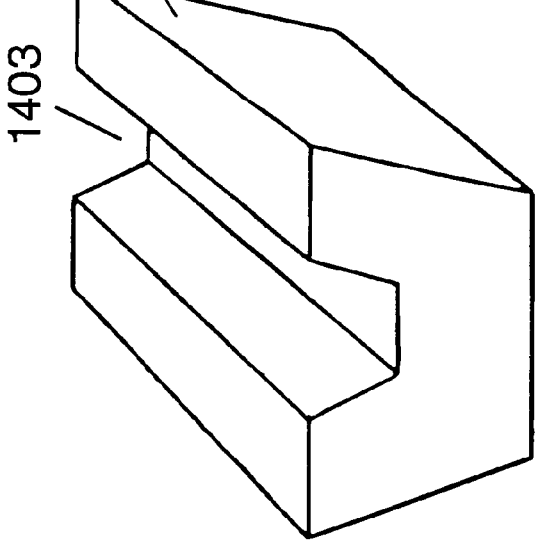

FIGS. 32A and 32B show a semiconductor light emitting device of Example 14 according to the present invention. In this example, stress is physically applied to the sides of a semiconductor light emitting element by use of a shape memory alloy so as to generate strain in an active layer.

Referring to FIG. 32A, a concave portion 1403 is formed on a Cu—Ni—Al shape memory alloy 1404. The width of the concave portion 1403 is 480 μm, which is slightly smaller than the width of a semiconductor light emitting element 1402 to be described later. The surfaces of the concave portion 1403 are lightly treated for insulation to prevent the semiconductor light emitting element 1402 from being short-circuited when the element is placed in the concave portion 1403.

First, the concave portion 1403 is mechanically enlarged, and the semiconductor light emitting element 1402 is placed in the concave portion 1403. The resultant structure is placed in a heating chamber and heated to 80° C. The shape memory alloy is thus heated and resumes the original shape. As a result, stress is applied to the semiconductor light emitting element 1402 in the x direction vertical to the stripe. This makes it possible to generate strain uniaxially (in the x direction) in the c plane of an active layer, and thus reduce the threshold current of the light emitting element.

Since the size of the concave portion 1403 of the shape memory alloy is predetermined, the stress applied to the light emitting element is determined depending on the size of the concave portion 1403. The concave portion 1403 enlarged to receive the light emitting element resumes the original shape only by heating. Accordingly, the mounting of the light emitting element is easy. The resultant structure with the light emitting element fitted in the shape memory alloy is a semiconductor light emitting device 1401.

The semiconductor light emitting element 1402 is fabricated by MOVPE in the following manner.

First, a well cleaned (0001) sapphire substrate (c plane) is placed on a susceptor in a reaction chamber. After a hydrogen atmosphere is established in the reaction chamber, the substrate is heated to 1080° C. to clean the substrate.

The substrate is then cooled to 505° C. Four liters/min. of ammonia and $30 \times 10^{-6}$ mols/min. of trimethyl gallium as the material gas and 2 liters/min. of hydrogen as the carrier gas are supplied, so as to form a GaN buffer layer on the substrate.

The supply of trimethyl gallium is then stopped. The substrate temperature is raised to 1080° C. Then, $50 \times 10^{-6}$ mols/min. of trimethyl gallium and $2 \times 10^{-9}$ mols/min. of silane gas are supplied, so as to form a silicon-doped n-type GaN layer.

Then, the supply of the material gas is stopped. The substrate temperature is lowered to 800° C. The carrier gas is switched from hydrogen to nitrogen. Then, 2 liters/min. of nitrogen and $2 \times 10^{-6}$ mols/min. of trimethyl gallium, $1 \times 10^{-5}$ mols/min. of trimethyl indium, $2 \times 10^{-6}$ mols/min. of diethyl cadmium, and 4 liters/min. of ammonia as the material gas are supplied, so as to form a cadmium-doped $In_{0.14}Ga_{0.86}N$ layer.

The supply of the material gas is then stopped. The substrate temperature is raised to 1080° C. Then, $50 \times 10^{-6}$ mols/min. of trimethyl gallium, $3.6 \times 10^{-6}$ mols/min. of cyclopentadienyl magnesium, and 4 liters/min. of ammonia are supplied, so as to form a p-type GaN layer.

The p-type GaN layer and the n-type InGaN layer of the semiconductor light emitting element are partly etched to expose the n-type GaN layer. P-type and n-type ohmic electrodes are formed on the p-type GaN layer and the n-type GaN layer, respectively. The semiconductor light emitting device of this example is obtained by mounting the thus-fabricated semiconductor light emitting element.

EXAMPLE 15

Figure 33A:
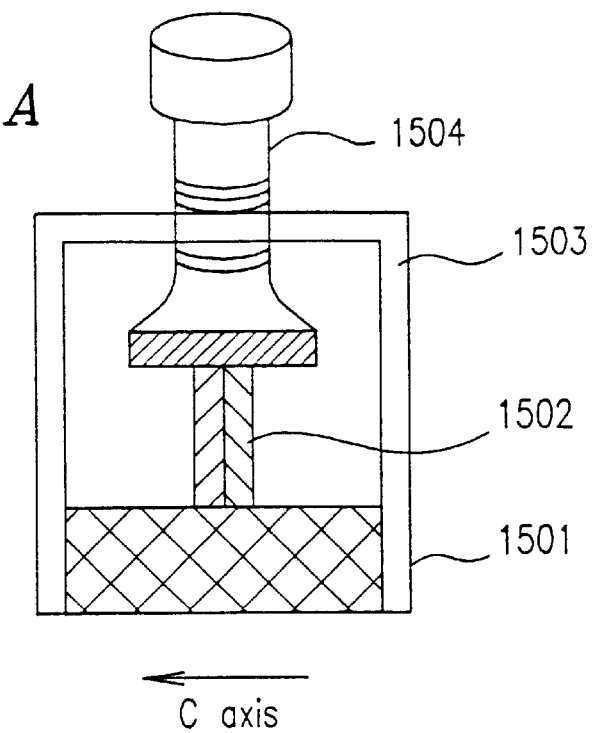
FIGS. 33A and 33B are sectional views of a semiconductor light emitting device of Example 15 according to the present invention.
Figure 33B:
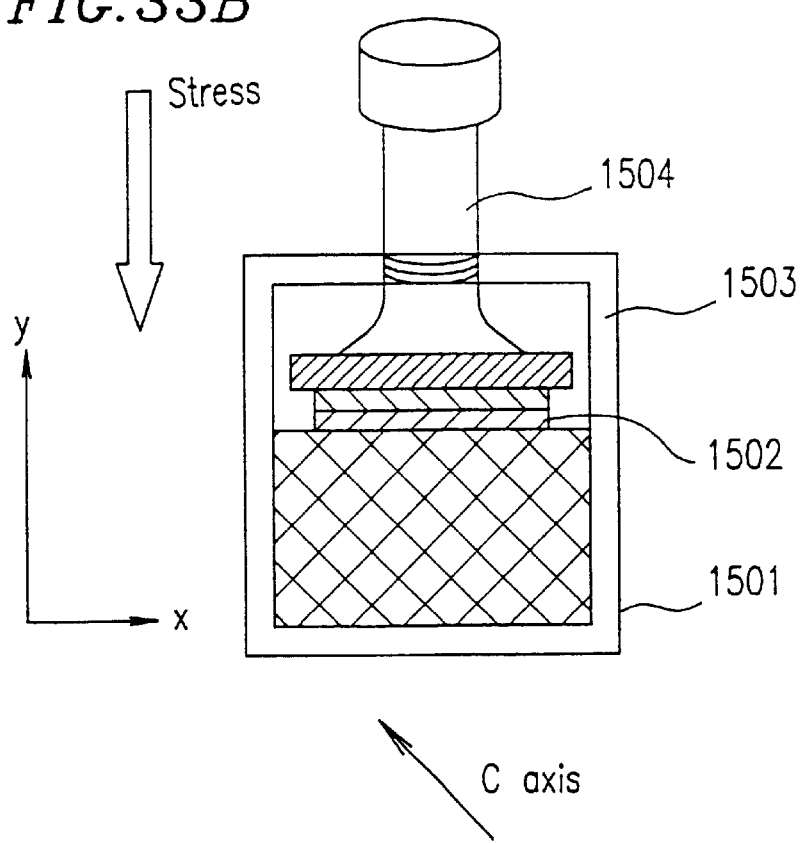

FIGS. 33A and 33B show a semiconductor light emitting device using the semiconductor light emitting element shown in Example 14. Stress is mechanically applied to the light emitting element from the sides thereof.

Referring to FIG. 33A, the semiconductor light emitting element is formed by growing AlGaInN crystal which is a hexagonal-system compound semiconductor on the (0001) plane (c plane). Accordingly, stress is applied to the semiconductor light emitting element from the sides thereof so as to generate strain uniaxially (in the y direction) in the c plane.

A semiconductor light emitting element 1502 is placed in a vessel 1503 for stress application, and stress is gradually applied to the semiconductor light emitting element 1502 from the sides thereof. The magnitude of the stress is adjustable by turning a handle 1504.

In FIG. 33A, the (0001) plane sapphire substrate is used for the substrate of the semiconductor light emitting element 1502. Instead, as shown in FIG. 33B, by using the R plane for the substrate and growing AlGaInN crystal on the substrate, stress can be applied in a direction vertical to the substrate (y direction). This is because, though the state density of the valence band cannot be reduced by generating strain in the c-axis direction, it can be drastically reduced by generating anisotropic strain in the c plane. Using the R plane for the substrate, the c axis is directed as shown in FIG. 33B. Accordingly, anisotropic strain can be generated in the c plane when stress is applied in the direction vertical to the substrate (y direction). Naturally, as described above with reference to FIG. 33A, anisotropic strain can also be generated in the c plane by applying stress from the sides of the semiconductor light emitting element grown on the R plane.

Thus, according to the method of this example, anisotropic strain can be mechanically generated in the c plane of the semiconductor light emitting element. Accordingly, the state density of the valence band can be reduced, and thus the threshold current for laser oscillation can be drastically reduced.

According to the present invention, based on the fact that, in the case of applying anisotropic strain in the c plane of a hexagonal-system compound semiconductor, the effective mass of holes near the top of the valence band is lowered, a semiconductor light emitting element with a reduced threshold current can be realized by generating anisotropic strain in the c plane of an active layer composed of a hexagonal-system compound semiconductor grown in the c-axis direction.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light emitting element comprising:
   a stripe-shaped layer, formed of a material selected from the group consisting of an amorphous layer, a SiO2 layer and a SiN layer, provided on a substrate;
   an epitaxial layer being lattice-mismatched with the substrate, the epitaxial layer formed on the stripe-shaped layer; and
   an active layer formed of a hexagonal-system compound semiconductor on the epitaxial layer, the active layer formed on the epitaxial layer, a strain in the active layer being anisotropic.

2. A semiconductor light emitting element according to claim 1, wherein the active layer is formed in a c-axis direction.

3. A semiconductor light emitting element according to claim 1, wherein the hexagonal-system compound semiconductor has a structure selected from the group including a wurtzite type, a 4H type and a 6H type.

4. A semiconductor light emitting element according to claim 1, wherein the active layer is formed of wurtzite-type $Al_xGA_yIN_zN$ ($0 \leq x \leq 1$, $0 \leq y \leq 1$, $0 \leq z \leq 1$).

* * * * *